US008027967B2

(12) United States Patent
Okada et al.

(10) Patent No.: US 8,027,967 B2
(45) Date of Patent: Sep. 27, 2011

(54) SETTING CHECKING INFORMATION COLLECTING METHOD, SETTING CHECKING INFORMATION COLLECTING DEVICE AND RECORDING MEDIUM THAT RECORDS SETTING CHECKING INFORMATION COLLECTING PROGRAM

(75) Inventors: Toshiro Okada, Kawasaki (JP); Toshiya Yamazaki, Kawasaki (JP); Takeo Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 255 days.

(21) Appl. No.: 12/458,859

(22) Filed: Jul. 24, 2009

(65) Prior Publication Data

US 2009/0287661 A1     Nov. 19, 2009

Related U.S. Application Data

(63) Continuation of application No. PCT/JP2007/051466, filed on Jan. 30, 2007.

(51) Int. Cl.
*G06F 17/30*     (2006.01)
(52) U.S. Cl. ........................... 707/706; 707/755
(58) Field of Classification Search .................. 707/706, 707/755
See application file for complete search history.

(56) References Cited

U.S. PATENT DOCUMENTS

| | | | | |
|---|---|---|---|---|
| 6,035,297 | A * | 3/2000 | Van Huben et al. | 707/695 |
| 6,671,681 | B1 * | 12/2003 | Emens et al. | 707/706 |
| 6,681,218 | B1 * | 1/2004 | Zou | 707/696 |
| 6,701,318 | B2 * | 3/2004 | Fox et al. | 707/706 |
| 6,732,092 | B2 * | 5/2004 | Lucas et al. | 707/706 |
| 6,782,383 | B2 * | 8/2004 | Subramaniam et al. | 707/706 |
| 6,879,978 | B2 * | 4/2005 | Yoshiura et al. | 707/706 |
| 6,907,424 | B1 * | 6/2005 | Neal et al. | 707/706 |
| 7,031,968 | B2 * | 4/2006 | Kremer et al. | 707/706 |
| 7,039,625 | B2 * | 5/2006 | Kim et al. | 707/706 |
| 7,146,356 | B2 * | 12/2006 | Choi et al. | 707/706 |
| 7,162,481 | B2 * | 1/2007 | Richardson et al. | 707/693 |
| 7,165,080 | B2 * | 1/2007 | Kotcheff et al. | 707/706 |
| 2008/0091387 | A1 | 4/2008 | Yamazaki et al. | |

FOREIGN PATENT DOCUMENTS

JP     6-131411     5/1994

(Continued)

OTHER PUBLICATIONS

International Search Report for PCT/JP2007/051466, mailed Mar. 13, 2007.
English Translation of the International Report on Patentability and Written Opinion mailed Aug. 13, 2009 and issued in corresponding International Patent Application PCT/JP2007/051466.

*Primary Examiner* — Don Wong
*Assistant Examiner* — Kim Nguyen
(74) *Attorney, Agent, or Firm* — Staas & Halsey LLP

(57) ABSTRACT

A device includes, a search controlling information storing unit that stores, for each searching purpose, the search controlling information indicating whether or not the search is to be proceeded for the kinds of parts between the interfaces in the parts is defined and registered, a set information collecting unit that decides the interface of the parts to be searched, according to the search controlling information for each search object, from both the design information of the system constitution diagram and the registered information of the library database of the parts and the interfaces, and traces the connection relations of the interfaces thereby to collect the set information of the searched parts and the interfaces from the library database of the design information of the system constitution diagram, the parts and so on.

6 Claims, 22 Drawing Sheets

FOREIGN PATENT DOCUMENTS

| | | |
|---|---|---|
| JP | 06-187396 | 7/1994 |
| JP | 8-36592 | 2/1996 |
| JP | 2001-53780 | 2/2001 |
| WO | 2006/117831 | 11/2006 |

\* cited by examiner

| SEARCH PROTOCOL → CODE<br>COLLECTED DATA ↓ INFORMATION | IPV4 | POWER | SAN | ... |
|---|---|---|---|---|
| | IPV4 SETTING, IP FORWARD | FUNCTION POWER SUPPLY SPECIFICATION | WWN WWPN ZONE NAME LUN | ... |
| SEARCH CODE | TOPOLOGY CODE | TOPOLOGY CODE | TOPOLOGY CODE | ... |
| COMP | MATRIX (IP FORWARD = ON) BLOCK (IP FORWARD = OFF) | BLOCK | BLOCK | ... |
| HUB | MATRIX | BLOCK | BLOCK | ... |
| PCI | REPEATER | BLOCK | REPEATER | ... |
| TERM | BLOCK | BLOCK | BLOCK | ... |
| NFB | BLOCK | REPEATER | BLOCK | ... |
| ... | ... | ... | ... | ... |

FIG. 5

TOPOLOGY CODE [BLOCK]
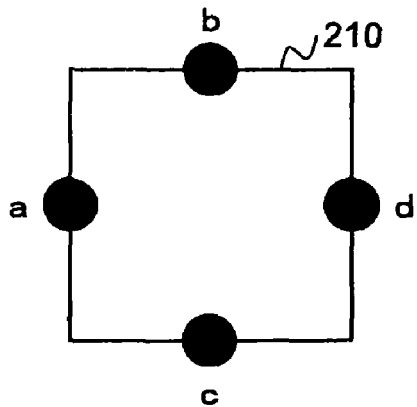
TOPOLOGY CODE [MATRIX]
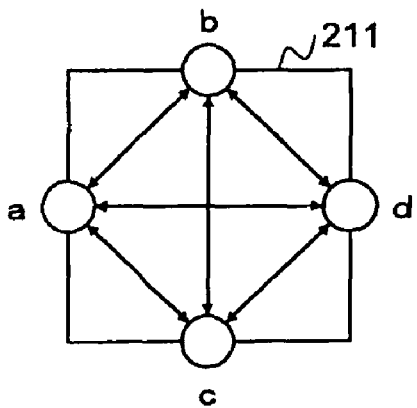
○ : COMPOSITE or BIDIRECTIONAL
□ : CONTROLLED or INPUT
▷ : CONTROL or OUTPUT
● : ALL ABOVE KINDS
TOPOLOGY CODE [REPEATER]
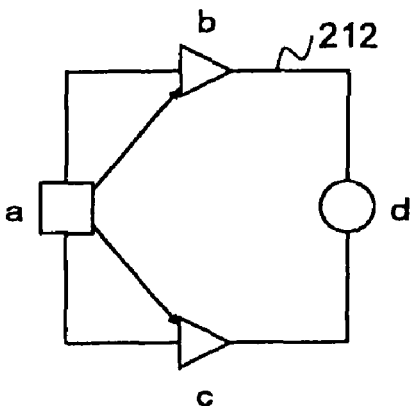
FIG. 6

| COMPONENTS MODEL NAME | SEARCH CODE | FUNCTION | PROPERTY 1 | PROPERTY 2 | PROPERTY 3 | ... |
|---|---|---|---|---|---|---|
| PN-HUB-1 | HUB | | POWER CONSUMPTION = 100W | IP ADDRESS = ? | SUBNET NAME = ? | ... |
| PN-NIC-1 | NIC | | | IP FORWARD = ? | | ... |
| PN-SVR-1 | COMP | | POWER CONSUMPTION = 500W | | | ... |
| PN-NFB-1 | NFB | BREAKER | INTERRUPTING CURRENT = 30 A | | | ... |
| PN-PS-1 | TERM | POWER SUPPLY | | | | ... |
| ... | ... | ... | ... | ... | ... | ... |

FIG. 7

| COMPONENTS MODEL NAME | INTERFACE ID | RELATED PROTOCOL | ROLE | PROPERTY 1 | PROPERTY 2 | PROPERTY 3 | ... |
|---|---|---|---|---|---|---|---|
| PN-HUB-1 | port1 | IPV4 | COMPOSITE | | | | ... |
| | port2 | IPV4 | COMPOSITE | | | | ... |
| | port3 | IPV4 | COMPOSITE | | | | ... |
| | AC100V_in | POWER | INPUT | VOLTAGE = 100V | FREQUENCY = 50,60Hz | NUMBER OF PHASES = 1 | ... |
| PN-NIC-1 | pci10 | IPV4 | CONTROLLED | | | | ... |
| | lan10 | IPV4 | COMPOSITE | IP ADDRESS = ? | SUBNET NAME = ? | | ... |
| PN-SVR-1 | lan0 | IPV4 | COMPOSITE | IP ADDRESS = ? | SUBNET NAME = ? | | ... |
| | lan1 | IPV4 | COMPOSITE | IP ADDRESS = ? | SUBNET NAME = ? | | ... |
| | pci1 | IPV4,SAN | CONTROL | | | | ... |
| | AC100V_in | POWER | INPUT | VOLTAGE = 100 TO 240V | FREQUENCY = 50,60Hz | NUMBER OF PHASES = 1 | ... |
| PN-NFB-1 | AC_in | POWER | INPUT | | | | ... |
| | AC_out | POWER | OUTPUT | | | | ... |
| PN-PS-1 | AC100V_out | POWER | OUTPUT | VOLTAGE = 100V | FREQUENCY = 50Hz | NUMBER OF PHASES = 1 | ... |
| ... | ... | ... | ... | ... | ... | ... | ... |

FIG. 8

| COMPONENTS ID | COMPONENTS MODEL NAME | PROPERTY 1 | PROPERTY 2 | PROPERTY 3 | ... |
|---|---|---|---|---|---|
| SERVER 1 | PN-SVR-1 | IP FORWARD = OFF | | | ... |
| SERVER 2 | PN-SVR-1 | IP FORWARD = ON | | | ... |
| HUB 1 | PN-HUB-1 | IP ADDRESS =192.168.1.1/24 | SUBNET NAME = TEST | | ... |
| NIC CARD 1 | PN-NIC-1 | | | | ... |
| BREAKER 1 | PN-NFB-1 | | | | ... |
| POWER SUPPLY 1 | PN-PS-1 | | | | ... |

FIG. 10

| COMPONENTS ID | INTERFACE ID | PROPERTY 1 | PROPERTY 2 | PROPERTY 3 | ... |
|---|---|---|---|---|---|
| SERVER 1 | lan0 | IP ADDRESS = NONE | SUBNET NAME = NONE | | ... |
| SERVER 1 | lan1 | IP ADDRESS = NONE | SUBNET NAME = NONE | | ... |
| SERVER 1 | pci1 | | | | ... |
| SERVER 1 | AC100V_in | | | | ... |
| SERVER 2 | lan0 | IP ADDRESS =192.168.1.3/24 | SUBNET NAME = TEST | | ... |
| SERVER 2 | lan1 | IP ADDRESS = NONE | SUBNET NAME = NONE | | ... |
| SERVER 2 | pci1 | | | | ... |
| SERVER 2 | AC100V_in | | | | ... |
| HUB 1 | port1 | | | | ... |
| HUB 1 | port2 | | | | ... |
| HUB 1 | port3 | | | | ... |
| HUB 1 | AC100V_in | | | | ... |
| NIC CARD 1 | pci10 | | | | ... |
| NIC CARD 1 | lan10 | IP ADDRESS =192.168.1.2/24 | SUBNET NAME = TEST | | ... |
| BREAKER 1 | AC_in | | | | ... |
| BREAKER 1 | AC_out | | | | ... |
| POWER SUPPLY 1 | AC100V_out | | | | ... |

FIG. 11

| NET NAME | START POINT COMPONENTS ID | START POINT INTERFACE ID | END POINT COMPONENTS ID | END POINT INTERFACE ID |
|---|---|---|---|---|
| N1 | NIC CARD 1 | lan10 | HUB 1 | port1 |
| N2 | SERVER 2 | lan0 | HUB 1 | port2 |
| N3 | SERVER 1 | pci1 | NIC CARD 1 | pci10 |
| N4 | HUB 1 | AC100V_in | BREAKER 1 | AC_out |
| N5 | POWER SUPPLY 1 | AC100V_out | BREAKER 1 | AC_in |
| N6 | SERVER 1 | AC100V_in | SERVER 2 | AC100V_in |

FIG. 12

| COMPONENTS ID | COMPONENTS MODEL NAME | INTERFACE ID | SEARCH TARGET FLAG | SEARCH COMPLETION FLAG |
|---|---|---|---|---|
| SERVER 1 | PN-SVR-1 | lan0 | UNKNOWN | UNSEARCHED |
| SERVER 1 | PN-SVR-1 | lan1 | UNKNOWN | UNSEARCHED |
| SERVER 1 | PN-SVR-1 | pci1 | UNKNOWN | UNSEARCHED |
| SERVER 1 | PN-SVR-1 | AC100V_in | UNKNOWN | UNSEARCHED |
| SERVER 2 | PN-SVR-1 | lan0 | UNKNOWN | UNSEARCHED |
| SERVER 2 | PN-SVR-1 | lan1 | UNKNOWN | UNSEARCHED |
| SERVER 2 | PN-SVR-1 | pci1 | UNKNOWN | UNSEARCHED |
| SERVER 2 | PN-SVR-1 | AC100V_in | UNKNOWN | UNSEARCHED |
| HUB 1 | PN-HUB-1 | port1 | UNKNOWN | UNSEARCHED |
| HUB 1 | PN-HUB-1 | port2 | UNKNOWN | UNSEARCHED |
| HUB 1 | PN-HUB-1 | port3 | UNKNOWN | UNSEARCHED |
| HUB 1 | PN-HUB-1 | AC100V_in | UNKNOWN | UNSEARCHED |
| NIC CARD 1 | PN-NIC-1 | pci10 | UNKNOWN | UNSEARCHED |
| NIC CARD 1 | PN-NIC-1 | lan10 | UNKNOWN | UNSEARCHED |
| BREAKER 1 | PN-NFB-1 | AC_in | UNKNOWN | UNSEARCHED |
| BREAKER 1 | PN-NFB-1 | AC_out | UNKNOWN | UNSEARCHED |
| POWER SUPPLY 1 | PN-PS-1 | AC100V_out | UNKNOWN | UNSEARCHED |

FIG. 13

| SEARCH NET NUMBER | COMPONENTS ID | INTERFACE ID | FUNCTION | PROPERTY 1 | PROPERTY 2 | PROPERTY 3 | ... |
|---|---|---|---|---|---|---|---|
| 1 | SERVER 1 | | | POWER CONSUMPTION = 500W | | | ... |
| 1 | SERVER 1 | AC100V_in | | VOLTAGE = 100 TO 240 V | FREQUENCY = 50, 60Hz | NUMBER OF PHASES = 1 | ... |
| 1 | SERVER 2 | AC100V_in | | VOLTAGE = 100 TO 240 V | FREQUENCY = 50, 60Hz | NUMBER OF PHASES = 1 | ... |
| 1 | SERVER 2 | | | POWER CONSUMPTION = 500W | | | ... |
| 2 | HUB 1 | | | POWER CONSUMPTION = 100W | | | ... |
| 2 | HUB 1 | AC100V_in | | VOLTAGE = 100V | FREQUENCY = 50, 60Hz | NUMBER OF PHASES = 1 | ... |
| 2 | BREAKER 1 | AC_out | | | | | ... |
| 2 | BREAKER 1 | | ブレーカ | INTERRUPTING CURRENT = 30 A | | | ... |
| 2 | BREAKER 1 | AC_in | | | | | ... |
| 2 | POWER SUPPLY 1 | AC100V_out | | VOLTAGE = 100V | FREQUENCY = 50Hz | NUMBER OF PHASES = 1 | ... |
| 2 | POWER SUPPLY 1 | | POWER SUPPLY | | | | ... |

| SEARCH NET NUMBER | COMPONENTS ID | INTERFACE ID | FUNCTION | PROPERTY 1 | PROPERTY 2 | PROPERTY 3 | ... |
|---|---|---|---|---|---|---|---|
| 1 | SERVER 1 | | | IP FORWARD = OFF | | | ... |
| 1 | SERVER 1 | lan0 | | IP ADDRESS = NONE | SUBNET NAME = NONE | | ... |
| 1 | SERVER 1 | lan1 | | IP ADDRESS = NONE | SUBNET NAME = NONE | | ... |
| 1 | SERVER 1 | pci1 | | | | | ... |
| 1 | NIC CARD 1 | pci10 | | | | | ... |
| 1 | NIC CARD 1 | | | | | | ... |
| 1 | NIC CARD 1 | lan10 | | IP ADDRESS = 192.168.1.2/24 | SUBNET NAME = TEST | | ... |
| 1 | HUB 1 | port1 | | | | | ... |
| 1 | HUB 1 | | | IP ADDRESS = 192.168.1.1/24 | SUBNET NAME = TEST | | ... |
| 1 | HUB 1 | port2 | | | | | ... |
| 1 | SERVER 2 | lan0 | | IP ADDRESS = 192.168.1.3/24 | SUBNET NAME = TEST | | ... |
| 1 | SERVER 2 | | | IP FORWARD = ON | | | ... |
| 1 | SERVER 2 | lan1 | | IP ADDRESS = NONE | SUBNET NAME = NONE | | ... |
| 1 | SERVER 2 | pci1 | | | | | ... |
| 1 | HUB 1 | port3 | | | | | ... |

| COMPONENTS ID | COMPONENTS MODEL NAME | INTERFACE ID | SEARCH TARGET FLAG | SEARCH COMPLETION FLAG |
|---|---|---|---|---|
| SERVER 1 | PN-SVR-1 | lan0 | NOT TO BE SEARCHED | COMPLETED |
| SERVER 1 | PN-SVR-1 | lan1 | NOT TO BE SEARCHED | COMPLETED |
| SERVER 1 | PN-SVR-1 | pci1 | NOT TO BE SEARCHED | COMPLETED |
| SERVER 1 | PN-SVR-1 | AC100V_in | TO BE SEARCHED | UNSEARCHED |
| SERVER 2 | PN-SVR-1 | lan0 | NOT TO BE SEARCHED | COMPLETED |
| SERVER 2 | PN-SVR-1 | lan1 | NOT TO BE SEARCHED | COMPLETED |
| SERVER 2 | PN-SVR-1 | pci1 | NOT TO BE SEARCHED | COMPLETED |
| SERVER 2 | PN-SVR-1 | AC100V_in | TO BE SEARCHED | UNSEARCHED |
| HUB 1 | PN-HUB-1 | port1 | NOT TO BE SEARCHED | COMPLETED |
| HUB 1 | PN-HUB-1 | port2 | NOT TO BE SEARCHED | COMPLETED |
| HUB 1 | PN-HUB-1 | port3 | NOT TO BE SEARCHED | COMPLETED |
| HUB 1 | PN-HUB-1 | AC100V_in | TO BE SEARCHED | UNSEARCHED |
| NIC CARD 1 | PN-NIC-1 | pci10 | NOT TO BE SEARCHED | COMPLETED |
| NIC CARD 1 | PN-NIC-1 | lan10 | NOT TO BE SEARCHED | COMPLETED |
| BREAKER 1 | PN-NFB-1 | AC_in | TO BE SEARCHED | UNSEARCHED |
| BREAKER 1 | PN-NFB-1 | AC_out | TO BE SEARCHED | UNSEARCHED |
| POWER SUPPLY 1 | PN-PS-1 | AC100V_out | TO BE SEARCHED | UNSEARCHED |

FIG. 23

| COMPONENTS ID | COMPONENTS MODEL NAME | INTERFACE ID | SEARCH TARGET FLAG | SEARCH COMPLETION FLAG |
|---|---|---|---|---|
| SERVER 1 | PN-SVR-1 | lan0 | NOT TO BE SEARCHED | COMPLETED |
| SERVER 1 | PN-SVR-1 | lan1 | NOT TO BE SEARCHED | COMPLETED |
| SERVER 1 | PN-SVR-1 | pci1 | NOT TO BE SEARCHED | COMPLETED |
| SERVER 1 | PN-SVR-1 | AC100V_in | TO BE SEARCHED | COMPLETED |
| SERVER 2 | PN-SVR-1 | lan0 | NOT TO BE SEARCHED | COMPLETED |
| SERVER 2 | PN-SVR-1 | lan1 | NOT TO BE SEARCHED | COMPLETED |
| SERVER 2 | PN-SVR-1 | pci1 | NOT TO BE SEARCHED | COMPLETED |
| SERVER 2 | PN-SVR-1 | AC100V_in | TO BE SEARCHED | COMPLETED |
| HUB 1 | PN-HUB-1 | port1 | NOT TO BE SEARCHED | COMPLETED |
| HUB 1 | PN-HUB-1 | port2 | NOT TO BE SEARCHED | COMPLETED |
| HUB 1 | PN-HUB-1 | port3 | NOT TO BE SEARCHED | COMPLETED |
| HUB 1 | PN-HUB-1 | AC100V_in | TO BE SEARCHED | UNSEARCHED |
| NIC CARD 1 | PN-NIC-1 | pci10 | NOT TO BE SEARCHED | COMPLETED |
| NIC CARD 1 | PN-NIC-1 | lan10 | NOT TO BE SEARCHED | COMPLETED |
| BREAKER 1 | PN-NFB-1 | AC_in | TO BE SEARCHED | UNSEARCHED |
| BREAKER 1 | PN-NFB-1 | AC_out | TO BE SEARCHED | UNSEARCHED |
| POWER SUPPLY 1 | PN-PS-1 | AC100V_out | TO BE SEARCHED | UNSEARCHED |

| COMPONENTS ID | COMPONENTS MODEL NAME | INTERFACE ID | SEARCH TARGET FLAG | SEARCH COMPLETION FLAG |
|---|---|---|---|---|
| SERVER 1 | PN-SVR-1 | lan0 | TO BE SEARCHED | UNSEARCHED |
| SERVER 1 | PN-SVR-1 | lan1 | TO BE SEARCHED | UNSEARCHED |
| SERVER 1 | PN-SVR-1 | pci1 | TO BE SEARCHED | UNSEARCHED |
| SERVER 1 | PN-SVR-1 | AC100V_in | NOT TO BE SEARCHED | COMPLETED |
| SERVER 2 | PN-SVR-1 | lan0 | TO BE SEARCHED | UNSEARCHED |
| SERVER 2 | PN-SVR-1 | lan1 | TO BE SEARCHED | UNSEARCHED |
| SERVER 2 | PN-SVR-1 | pci1 | TO BE SEARCHED | UNSEARCHED |
| SERVER 2 | PN-SVR-1 | AC100V_in | NOT TO BE SEARCHED | COMPLETED |
| HUB 1 | PN-HUB-1 | port1 | TO BE SEARCHED | UNSEARCHED |
| HUB 1 | PN-HUB-1 | port2 | TO BE SEARCHED | UNSEARCHED |
| HUB 1 | PN-HUB-1 | port3 | TO BE SEARCHED | UNSEARCHED |
| HUB 1 | PN-HUB-1 | AC100V_in | NOT TO BE SEARCHED | COMPLETED |
| NIC CARD 1 | PN-NIC-1 | pci10 | TO BE SEARCHED | UNSEARCHED |
| NIC CARD 1 | PN-NIC-1 | lan10 | TO BE SEARCHED | UNSEARCHED |
| BREAKER 1 | PN-NFB-1 | AC_in | NOT TO BE SEARCHED | COMPLETED |
| BREAKER 1 | PN-NFB-1 | AC_out | NOT TO BE SEARCHED | COMPLETED |
| POWER SUPPLY 1 | PN-PS-1 | AC100V_out | NOT TO BE SEARCHED | COMPLETED |

| COMPONENTS ID | INTERFACE ID | IP ADDRESS (TEST:192.168.1.0/24) |
|---|---|---|
| HUB 1 | | 192.168.1.1 |
| NIC CARD 1 | lan10 | 192.168.1.2 |
| SERVER 2 | lan0 | 192.168.1.3 |

FIG. 26

SETTING CHECKING INFORMATION COLLECTING METHOD, SETTING CHECKING INFORMATION COLLECTING DEVICE AND RECORDING MEDIUM THAT RECORDS SETTING CHECKING INFORMATION COLLECTING PROGRAM

CROSS-REFERENCE TO RELATED APPLICATION

This application is a continuation of the PCT International patent application PCT/JP2007/051466, filed on Jan. 30, 2007, the entire contents which are incorporate d herein by reference.

FIELD

The present invention relates to a technique of collecting setting information on a structure diagram of a computer system when converting a design of the computer system to CAD format data or expressing the design as an electronic drawing, also a technique of checking validities of connection relations between components and validities of settings in the structure diagram of the computer system, and more particularly, to a setting checking information collecting method, setting checking information collecting device and recording medium that records a setting checking information collecting program capable of automatically collecting setting information on the structure diagram of the computer system while tracing the connection relations for each purpose of collecting the setting information.

BACKGROUND

When a system structure diagram of a computer system is expressed, it is a general practice to express a system structure diagram focusing on connection relations of its electric interfaces. The design quality of the system is drastically improved by converting such a system structure diagram into electronic form and checking design errors at the design stage.

In order to check design errors in the system structure diagram, it is necessary to collect and check connection relations between apparatuses and information set in the connection interfaces and apparatuses. Unlike an electronic circuit, a computer system has a mixture of many standards in its electric interfaces. Therefore, necessary information, connection relations to be checked and interfaces that can be ignored vary depending on the testing contents.

When, for example, the supply performance of a power supply is checked, it is necessary to search paths of only a power supply system out of the interfaces of the apparatuses, acquire and check information on the power supply such as a voltage, frequency, the number of phases and capacity of the breaker. Furthermore, when checking the settings of IP addresses, it is necessary to search not only a LAN port but also various routes such as a PCI slot route and USB route, collect information and check whether or not these settings are correct.

Patent Document 1 is one example of documents of prior arts describing techniques related to testing of a system structure diagram. Patent Document 1 (Japanese Patent Laid-Open No. 6-187396) describes a technique of verifying validities of combinations of devices based on combinations of attribute information set in each device in a network configuration design.

When a system structure diagram of a computer is tested, necessary information, connection relations to be checked and interfaces that can be ignored or the like vary depending on testing contents. However, no mechanism for collecting setting information of a system structure diagram according to a variety of testing contents or mechanism capable of conducting tests uniformly has been conventionally invented. Therefore, for most of various testing contents, people generally display information set in a system design on a screen individually using, for example, CAD and thereby test them through visual checking. This results in a problem that testing takes quite a long time and overlooking often occurs in testing.

If setting checking information necessary for testing is outputted as a list of information classified by the purpose corresponding to the testing contents, testing can be conducted in a relatively short time even when humans do the testing and overlooking may be reduced. Furthermore, if there is a file of setting checking information organized according to the testing contents, testing may also be automated. Here, there are a variety of test targets such as a check of redundant power supply connections, check of power supply capacity, identification of an IP level communication range, detection of a loop, detection of illegal IP setting, separation error detection by PVLAN, check of switchover by a console switch, and hereinafter the purpose of collecting information for these tests will be referred to as a "search purpose."

To obtain a list of information of the setting checking information necessary for various kinds of testing, it is necessary to provide a program for automatically collecting setting information in a designed system structure diagram for each of testing contents. However, attempting to provide a program tailored to a plurality of testing contents results in a problem that the program becomes complicated and the scale of the program becomes enormous. Moreover, when another testing needs to be newly added, the program must be remodeled every time. Patent Document 1 above describes a technique of outputting specific setting checking information, but describes no technique related to a mechanism for collecting information for each of the various kinds of testing contents.

SUMMARY

An embodiment discussed herein can solve the above described problems. The embodiment discussed herein is provided a setting checking information collecting method for a computer to search a system structure diagram and collect information necessary for checking setting information according to search purposes based on electronic information of the system structure diagram including information on components, interface connection information between the components and property information set therein, includes a step of inputting the system structure diagram and determining, for each of the search purposes, one component in the system structure diagram as a search starting component according to each search purpose stored in a search controlling information storing unit that stores information indicating data to be collected and topology information indicating whether or not a search is to be proceeded between interfaces in the components for each component or classification information thereof or a search direction or a search purpose specified from outside; a step of looking up a components/interface information storing unit in which information on the components used in the system structure diagram, information on interfaces of the components, information indicating relations between the interfaces and search purposes are registered beforehand sequentially starting from the search starting component, obtaining an interface that belongs to a component to be searched, looking up the search controlling information storing unit and determining an interface for which a search is to be proceeded according to the search purpose from among the interfaces; a step of likewise repeating a search for components connected to the interfaces for which the search is to be proceeded as new search targets and extracting information on the respective searched components or information on the interfaces or setting information of property information set therein defined as data to be collected by the search controlling information storing unit from the electronic information of the system structure diagram; and a step of forming the extracted setting information into a file and outputting the file.

Furthermore, the setting checking information collecting method includes a step of testing, based on the collected setting information, excess or deficiency or consistency of the setting information and outputting the testing result.

According to the discussed method, information for determining an interface to be searched according to a search purpose is defined beforehand for each component or classification information (kind) of the component, and therefore a versatile program can collect setting information related to the designed system structure diagram for each testing content. Furthermore, when a new testing item should be added, the present invention can add a new testing item by only defining a new search purpose, defining information for specifying setting information collected for the search purpose and setting topology for each correspondence between the search purpose and the component or the kind thereof. When new topology needs to be defined, the topology may only be defined. That is, the present invention makes it easy to extend a search purpose and simplifies creation of a program for a new search purpose. Alternatively, the present invention only needs to define search control information and needs not create a program to collect information according to a new search purpose.

The collection of setting information according to the present invention is not only intended to test a system structure diagram but also applicable to a case where a diagram for an actual system operator or a system construction operator. In this case, a search purpose may be defined so as to collect setting information according to the operation purpose.

The object and advantage of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 5 shows an example of search matrix;
FIG. 6 illustrates an example of topology;
FIG. 7 shows an example of components property table;
FIG. 8 shows an example of interface property table;
FIG. 10 shows an example of components property information;
FIG. 11 shows an example of interface property information;
FIG. 12 shows an example of netlist information;
FIG. 13 shows an example of search management table;
FIG. 14 shows an example of search result information;
FIG. 15 shows another example of search result information;
FIG. 23 shows an example of search management table in a search process;
FIG. 24 shows an example of search management table in a search process;
FIG. 25 shows an example of search management table in a search process;
and
FIG. 26 shows an example of IP address list.

DESCRIPTION OF EMBODIMENTS

An overview of the present invention will be explained using FIG. 1.

Figure 1:
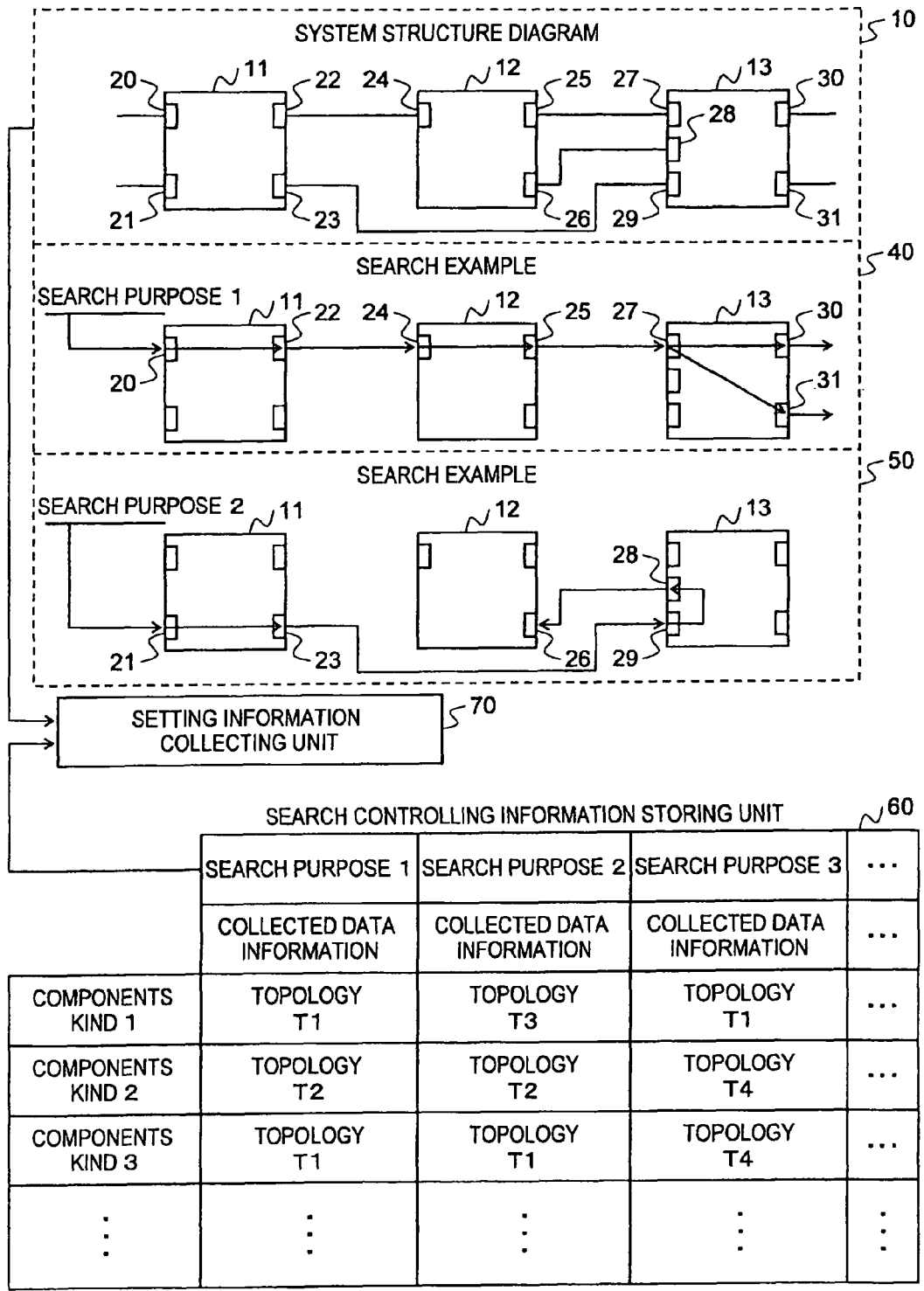
FIG. 1 illustrates an overview of the present invention.

In FIG. 1, a system structure diagram 10 is a drawing created by a CAD system. Reference numerals 11 to 13 in the system structure diagram 10 denote components that make up the designed system and 20 to 31 denote interfaces of the respective components. A design in the CAD system is realized by arranging components 11 to 13 in the system structure diagram 10 using a GUI (graphical user interface) and linking interfaces having connection relations between the components by lines. Furthermore, various attributes can be set in the respective components and interfaces. This attribute is referred to as "property information." That is, the system structure diagram 10 created by the CAD system includes information on the respective components, interface connection information between the components and property information set in the components. The present embodiment explains the system structure diagram created using a CAD system as an example, but the present invention is not limited to this and any data created using means other than a CAD system may also be used if it is at least system structure diagram data including similar information.

In order to collect information for a system designer to check design errors or information useful for a system installer, system administrator or the like from the system structure diagram 10, it is necessary to trace connection relations between components for each purpose of collecting information, that is, for each search purpose.

When, for example, the supply performance of a power supply is checked, it is necessary to search paths of only a power supply route out of the interfaces of the apparatuses, acquire information on the power supply such as voltage, frequency, the number of phases and capacity of the breaker or the like. Furthermore, when collecting information to check, for example, the IP address network system, paths of components to be searched and interfaces vary depending on whether or not each component of the system structure diagram 10 allows an IP protocol to pass.

Reference numeral 40 in FIG. 1 denotes a search example of components and interfaces in the case of search purpose 1 and 50 denotes a search example of components and interfaces in the case of search purpose 2. Thus, paths of components and interfaces to be searched vary depending on search purposes, but there are only conventional methods whereby people perform such searches on a display screen of the system structure diagram 10 or through a visual check on a printed sheet or create a program for collecting information for each search purpose and use the output of the program.

The present invention provides means that collects necessary setting checking information uniformly from the system structure diagram 10 according to a search purpose. Among these means that collect information uniformly, the most important one is a search controlling information storing unit 60. The following information is registered and stored in the search controlling information storing unit 60 as a database.

Collected data information indicating information to be collected from the design information (system structure diagram 10) of the CAD system is registered for each search purpose. Furthermore, information indicating whether or not to proceed a search between interfaces inside the components or indicating a search direction (this is referred to as "topology") is registered and stored for each search purpose with respect to a component or classification information (shown as a components kind in FIG. 1) of the component. That is, "topology" here is information modeling a question whether or not to trace connection relations by passing through the inside of a component between interfaces belonging to the component or so-called information indicating whether or not an electric signal of a search purpose passes through the inside of the component or a direction in which the electric signal passes. Some topology defines not only the passing direction but also an end point of an electric signal. The complexity of a topology model may also be eliminated by defining a topology model by combining a plurality of protocols that allow the electric signal to pass.

Furthermore, though not shown in FIG. 1, the present invention is further provided with a components/interface information storing unit in which information on components used for the system structure diagram 10, information on the interfaces of the components and information indicating relations between the interfaces and search purposes are registered beforehand. The components/interface information storing unit may also store information that defines the role on the topology model as required in addition to the information indicating the relations between the interfaces and the search purposes.

The setting information collecting unit 70 looks up the search controlling information storing unit 60 and the components/interface information storing unit according to the specified or selected search purpose, searches components and interfaces according to the search purposes in the system structure diagram 10 and performs processing of extracting the information set therein.

The search method for extracting information by the setting information collecting unit 70 is as follows. The setting information collecting unit 70 inputs the information of the system structure diagram 10 which is the output of the CAD system first. The setting information collecting unit 70 then determines the search purpose. The search purpose may be determined by the input of the specified information from an input apparatus or determined so as to sequentially select all search purposes registered in the search controlling information storing unit 60. Next, the setting information collecting unit 70 acquires the collected data information corresponding to the determined search purpose, that is, information indicating the kind of setting information from the search controlling information storing unit 60.

Of the interfaces belonging to the components arranged in the inputted system structure diagram 10, the interface whose information indicating associations with the search purpose matches the determined search purpose is the interface to be searched. Furthermore, of the components arranged in the inputted system structure diagram 10, components to which the interfaces to be searched belong are components to be searched. A search is proceeded by tracing the connection relations from the interface to be searched and the components to be searched in the process and setting information on the interface to be searched are collected from the information on the inputted system structure diagram and registered information such as a component library as required.

The setting information to be collected is information specified by the collected data information acquired from the search controlling information storing unit 60. When the component is encountered in the search process, the components kind set in the component is acquired and topology corresponding to the combination between the search purpose and components kind is acquired from the search controlling information storing unit 60. Furthermore, interfaces for which a search is to be proceeded inside the component is extracted from the information on the acquired topology and information on the role of the interfaces belonging to the component encountered in the search process as required. The search is proceeded by tracing the connection relations of the interface for which the extracted search is to be proceeded.

When the connection relations are interrupted, if components to be searched for which setting information has not been collected yet and interfaces to be searched remain, a search is proceeded again by tracing the connection relations from the remaining components to be searched and interfaces to be searched.

When collecting of setting information on all components to be searched and interfaces to be searched is completed, the processing ends and the search results are outputted. When the search results are outputted in a computer-readable format that allows visualization such as an XML document, the setting information can be outputted in an easy-to-see format and also when a structure testing program is created to automatically check the setting information, a program can be created more easily.

Hereinafter, more detailed embodiments of the present invention will be explained with reference to the accompanying drawings.

Figure 2:
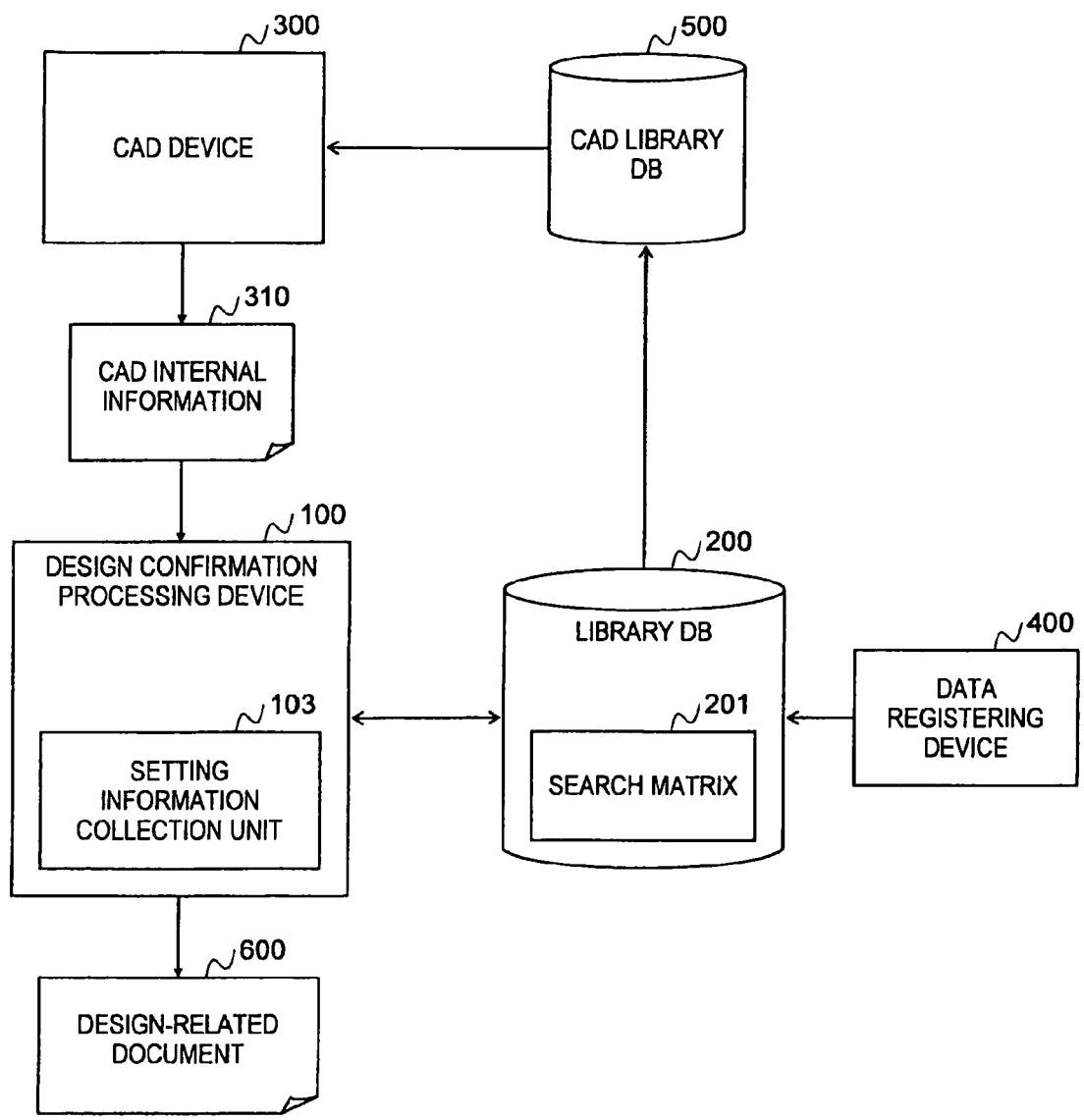
FIG. 2 illustrates an overall image of a system design according to an embodiment of the present invention.

FIG. 2 illustrates an overall image of a system design according to an embodiment of the present invention. The system design according to the present embodiment is mainly realized by a design confirmation processing device 100, a library database (DB) 200 and CAD device 300.

A designer conducts a system design using the CAD device 300. The design confirmation processing device 100 generates a design-related document 600 from CAD internal information 310, which is a system structure diagram designed by the CAD device 300. The library DB 200 stores all data necessary for the CAD device 300 and design confirmation processing device 100.

Necessary information is inputted to and registered in the library DB 200 using a data registering device 400 beforehand so as to be used for the system design and design confirmation. The inputted information is data such as the model name, name, size and power consumption of the product/component, bitmap data for drawing and information on the interfaces of the respective components and their functions.

Next, information necessary for drawing is extracted from the library DB 200 and a CAD library DB 500 is generated. The CAD device 300 operates by incorporating the information of the CAD library DB 500. The designer draws a system structure diagram using the CAD device 300. The processing of drawing the system structure diagram using the CAD device 300 is similar to a known technique of a system design using CAD, which is commonly used, and therefore detailed explanations will be omitted here.

Next, the CAD device 300 delivers the CAD internal information 310 of the designed system structure diagram to the design confirmation processing device 100 via, for example, a file. The CAD internal information 310 in this case includes a list of components and interfaces including information such as unique internal IDs, DB access codes, model names, list of connections between interfaces, and property information such as IP addresses set by the designer in the respective components and interfaces and SCSI information and so on.

The design confirmation processing device 100 analyzes the CAD internal information 310 delivered from the CAD device 300, compensates for lacking information by accessing the library DB 200, applies other necessary processing and generates the design-related document 600. Examples of the lacking information include a connection judging script, net search code for chasing connection relations on a design drawing, protocol information, fixed properties unnecessary for the design on the CAD device 300 and interface name that varies from one kind to another of output information or the like.

The library DB 200 stores a search matrix 201 corresponding to the search controlling information storing unit 60 shown in FIG. 1 beforehand in addition to the basic information of the components and interfaces used for CAD. The present invention mainly relates to a setting information collection unit 103 that collects necessary setting information in the design confirmation processing device 100. The setting information collection unit 103 corresponds to the setting information collecting unit 70 shown in FIG. 1.

Figure 3:
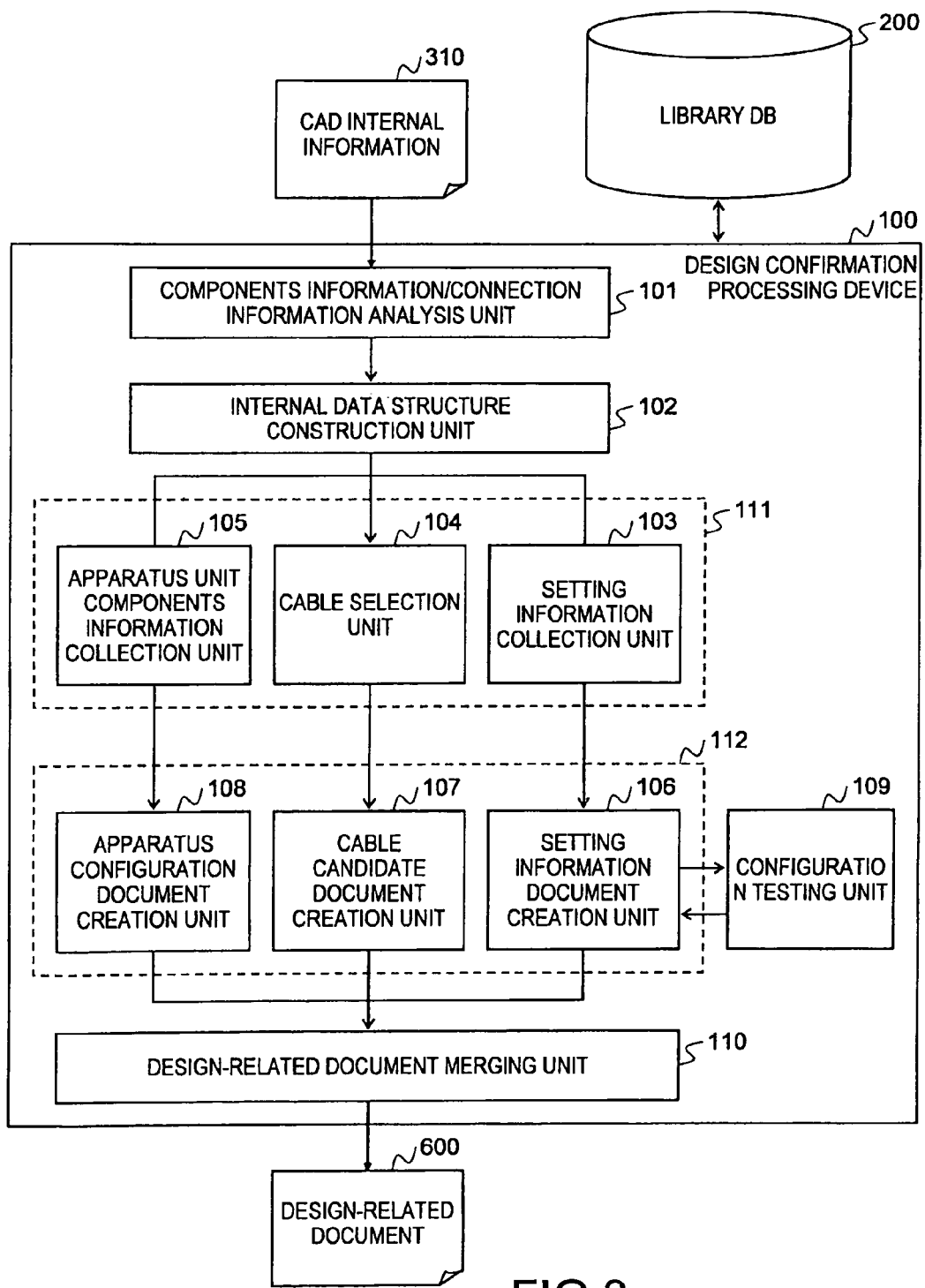
FIG. 3 shows a configuration example of a design confirmation processing device.

FIG. 3 shows a configuration example of the design confirmation processing device. The design confirmation processing device 100 looks up the library DB 200 and generates the design-related document 600 from the CAD internal information 310 of the system structure diagram created by the CAD device 300. The design confirmation processing device 100 is provided with a components information/connection information analysis unit 101, an internal data structure construction unit 102, a setting information collection unit 103, a cable selection unit 104, an apparatus unit components information collection unit 105, a setting information document creation unit 106, a cable candidate document creation unit 107, an apparatus configuration document creation unit 108, a configuration testing unit 109 and a design-related document merging unit 110.

Hereinafter, the portion including the setting information collection unit 103, cable selection unit 104 and apparatus unit components information collection unit 105 will be referred to as a "preliminary portion of processing for creating various documents 111." On the other hand, the portion including the setting information document creation unit 106, cable candidate document creation unit 107 and apparatus configuration document creation unit 108 will be referred to as a "subsequent portion of processing for creating various, documents 112."

The design confirmation processing device 100 receives the CAD internal information 310 of the system structure diagram from the CAD device 300. The CAD internal information 310 received is sent to the components information/connection information analysis unit 101 first.

The CAD internal information 310 includes not only the information of the components used in the system structure diagram and connection information but also information irrelevant to the generation of the design-related document 600 such as position information of the components on the system structure diagram. The CAD internal information 310 is outputted from the CAD device 300 as, for example, a CSV format file. The component information/connection information analysis section 101 performs processing of analyzing the format (CSV) first and then extracting only information on the components and connections. The information extracted by the component information/connection information analysis section 101 is sent to the internal data structure construction unit 102.

The internal data structure construction unit 102 converts identifiers of the components and connections sent from the CAD device 300 and their connection relationship to objects so as to be easily handled in subsequent processing and acquires lacking common information from the library DB 200. The "lacking common information" refers to, for example, information on "LAN interface with no cables connected because the use thereof is not set on the system structure diagram." The internal data object constructed by the internal data structure construction unit 102 is sent to the respective processing sections of the preliminary portion of processing for creating various documents 111, that is, the setting information collection unit 103, cable selection unit 104 and apparatus unit components information collection unit 105.

The preliminary portion of processing for creating various documents 111 performs processing of collecting information and processing of selecting information with reference to necessary components of the internal data objects and connection relations according to the respective purposes.

The setting information collection unit 103 collects paths in their connection relations and collects property information set in the respective component objects while tracing the connection relations from a certain component. In this case, the way the connection relations are traced may vary depending on the purpose of collecting the setting information. Here, information instructing how to trace connection relations according to the purpose of collecting the setting information is registered in the library DB 200 beforehand and it is possible to acquire the way the connection relations are traced according to the purpose of collecting setting information with reference to the library DB 200.

The cable selection unit 104 extracts interface information at both ends of the connection relations, judges whether or not the interfaces are directly connectable with each other or connectable via a cable, stores only the connectable ones and thereby selects a cable. The cable selection also includes a direct connection without any cable. In this case, the acquisition of a script expressing properties of the interfaces and properties of the cables is solved with reference to the library DB 200.

The apparatus unit components information collection unit 105 divides connection relations between components into intra-apparatus connections and inter-apparatus connections, ignores inter-apparatus connections and follows only intra-apparatus connections and thereby collects configuration information in apparatus units. In this case, information to make a distinction between inter-apparatus connections and intra-apparatus connections or the like is acquired from the library DB 200.

Since the information collected by the preliminary portion of processing for creating various documents 111 is information in an internal format, the information needs to be converted to a human-readable format. Therefore, the subsequent portion of processing for creating various documents 112 corresponding to the preliminary portion of processing for creating various documents 111, that is, the processing sections such as the setting information document creation unit 106, cable candidate document creation unit 107 and apparatus configuration document creation unit 108 are provided. The preliminary portion of processing for creating various documents 111 sends the collected information to the corresponding sections of the subsequent portion of processing for creating various documents 112.

The subsequent portion of processing for creating various documents 112 mainly performs formatting for outputting various kinds of collection information and a conversion from information in an internal format to information in a human-readable format. The "information in a human-readable format" refers to, for example, identification information of a component which is a simple symbol in the internal format converted to a name assigned to the component. The subsequent portion of processing for creating various documents 112 looks up the library DB 200 to perform such a conversion.

The setting information document creation unit 106 creates a setting information document from the setting information collected by the setting information collection unit 103. Furthermore, a configuration testing unit 109 may be provided so as to perform configuration testing on the setting information collected by the setting information collection unit 103. The "configuration testing" refers to testing as to whether or not there is any problem in the configuration and setting of the system structure diagram based on the collected setting information. This configuration testing performs, for example, testing on consistency to check whether there is any excess or deficiency of setting information or inconsistency of setting information. Since the information collected by the setting information collection unit 103 is compiled according to the search purposes, the setting information can be simply checked for excess or deficiency or consistency by a program according to the search purposes.

The configuration testing unit 109 may conduct testing by inputting the set document created by the setting information document creation unit 106 or a configuration may also be adopted in which the configuration testing unit 109 is provided between the setting information collection unit 103 and setting information document creation unit 106. The setting information document may be created by combining the collected setting information and the result of configuration testing or a different document may be created.

The cable candidate document creation unit 107 creates a cable candidate document based on the information on the cables collected by the cable selection unit 104 and the result of cable selection. The apparatus configuration document creation unit 108 creates an apparatus configuration document from apparatus unit configuration information collected by the apparatus unit components information collection unit 105.

Thus, providing the preliminary portion of processing for creating various documents 111 and the corresponding subsequent portion of processing for creating various documents 112 for every purpose allows various documents corresponding to various purposes to be created.

The subsequent portion of processing for creating various documents 112 outputs information of various documents according to the respective purposes. The design-related document merging unit 110 chooses the information of various documents outputted from the subsequent portion of processing for creating various documents 112 according to the purposes of the respective users and creates the design-related document 600 according to the purposes of the respective users.

For example, since a CE (customer engineer) who performs system construction related operations needs mainly hardware-related information such as intra-apparatus connection information and inter-apparatus connection information, apparatus configuration documents created by the apparatus unit components information collection unit 105, apparatus configuration document creation unit 108, and cable candidate documents generated by the cable selection unit 104 and cable candidate document creation unit 107 or the like are required.

Furthermore, since among people who perform system construction related operations likewise, an SE (system engineer) mainly needs software-related information, setting information documents created by the setting information collection unit 103 and setting information document creation unit 106 are indispensable and other documents are required only for reference purposes.

Furthermore, the information created by the cable selection unit 104 and cable candidate document creation unit 107 is indispensable to people involved in design who need to narrow down cable candidates. Moreover, the testing result by the configuration testing unit 109 also becomes feedback information to the system structure diagram, constituting necessary information for people involved in the design.

The subsequent portion of processing for creating various documents 112 can also create document information in a machine-readable format such as XML format to link up with other systems. This makes it possible, for example, to send information of a cable candidate document created by the cable candidate document creation unit 107 together with the apparatus information and connection information of the system structure diagram to a mounting solution device that carries out a mounting design on a rack and allows the mounting solution device to select a cable of an optimum length from among the narrowed-down cable candidates based on information of the cable candidate document.

Therefore, in the subsequent portion of processing for creating various documents 112, a plurality of processing sections may be arranged for one processing section of the preliminary portion of processing for creating various documents 111.

In such a system design environment, the present invention particularly relates to data registered in the setting information collection unit 103 and library DB 200.

Figure 4:
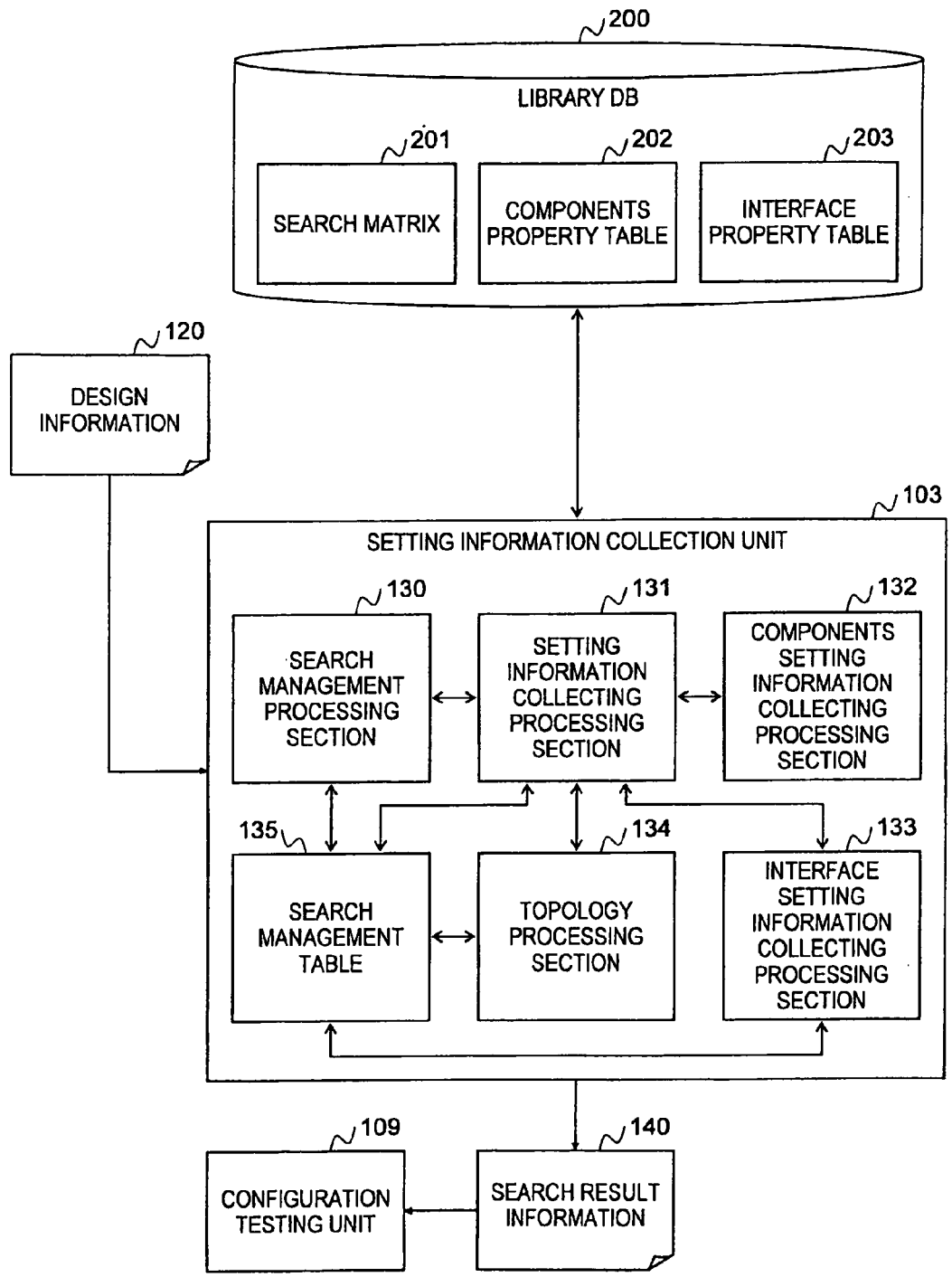
FIG. 4 shows a configuration example of a setting information collection unit and a library DB according to the present embodiment.

FIG. 4 shows a configuration example of the setting information collection unit and library DB according to the present embodiment. In FIG. 4, design information 120 is an internal data object created by the components information/connection information analysis unit 101 and the internal data structure construction unit 102 shown in FIG. 3 from the CAD internal information 310 of the system structure diagram. Search result information 140 is setting information collected by the setting information collection unit 103 according to the definition information of the search matrix 201 from the registered data of the design information 120 and library DB 200.

The search result information 140 is sent to the setting information document creation unit 106 shown in FIG. 3 and converted to a setting information document. Furthermore, the search result information 140 may also be configured so as to be sent to the configuration testing unit 109 to carry out configuration testing as is.

The setting information collection unit 103 is provided with a search management processing section 130, a setting information collecting processing section 131, a components setting information collecting processing section 132, an interface setting information collecting processing section 133 and a topology processing section 134. Furthermore, a search matrix 201, a components property table 202 and an interface property table 203 are registered in the library DB 200.

The search management processing section 130 performs management of an entire search such as creating a search management table 135 based on the design information 120, determining the search purpose and determining the search starting component or the like. The search management table 135 is a table that manages the situation of progress of a search and is initialized for each search purpose. Here, collection of setting information is also referred to as a "search."

The setting information collecting processing section 131 performs central processing for collecting setting information. The components setting information collecting processing section 132 performs processing of collecting necessary setting information on the components to be searched according to the search purpose from the design information 120 and a components property table 202 of the library DB 200. The interface setting information collecting processing section 133 performs processing of collecting necessary setting information on the interfaces to be searched according to the search purpose from the design information 120 and an interface property table 203 of the library DB 200. The topology processing section 134 looks up the registered data of the library DB 200, acquires topology of components encountered through the search and obtains interfaces that can be searched.

The configuration testing unit 109 inputs the search result information 140 and performs a configuration test. There are various kinds of configuration test such as a uniqueness test, essential condition test, value restriction test, consistency test and black list test and relation test between nets.

A uniqueness test tests whether or not the same value is set for items for which the same value must not be set on the same net. The same value must not be set with the same net such as IP address, host name and SCSI-ID.

An essential condition test tests whether or not a necessary setting has been made. Since a net generally comprises communication between two or more points, there must be two or more elements. As a specific example, a power supply system always requires a supply source and consumption source of power. A breaker can also be made essential as an intermediate element. Furthermore, if there is any interface whose IP address is not set on an IP net, there is a high possibility that the setting may have been omitted. Furthermore, if there is any apparatus whose SCSI-ID is not set on an SCSI net, there is a high possibility that the setting may have been forgotten.

A value restriction test tests whether or not the set numerical value is correct. For example, current consumption should not exceed the capacity of a breaker of a power supply system.

A consistency test tests consistency of a setting. If, for example, net addresses do not coincide with each other on the same IP net, there is a high possibility of setting errors.

A black list test tests congeniality between components connected on a net. When it is experimentally known that an error occurs in a combination of components of a specific model name, a warning is given if the net is not set in such a combination.

An inter-net relationship test tests a relation between redundant nets. When, for example, there are two independent nets having the same purpose between two apparatuses, it is possible to judge that redundancy is complete. There are apparatuses such as servers that have two power supply systems to provide redundancy for the power supply, but unless there are two independent net systems between the server and the power supply source, the setting is insufficient. Furthermore, if an intermediate breaker is shared, interruption of the breaker causes both systems to be interrupted simultaneously and redundancy becomes meaningless.

Examples of a search matrix 201, a components property table 202 and an interface property table 203 registered in the library DB 200 will be explained using FIG. 5 to FIG. 8.

FIG. 5 shows an example of search matrix. The search matrix 201 is a table to obtain data to be collected through a search of the search purpose and topology corresponding to each component from a search protocol code and a search code. Here, the search purpose is also referred to as a "search protocol." The search protocol code is an identification code set for each search purpose. The search code is a classification code set for each registered component of the library DB 200.

In the search matrix in FIG. 5, in a search of search protocol code "IPV4," for example, specifying a communication range of the IP level and detecting an illegal setting of IP or the like are assumed to be the search purposes. Therefore, according to this search protocol, IPV4-related set data (IP address, subnet name or the like) and set data of IP forward or the like are collected data. The IP forward is setting information indicating whether or not the component relays IP communication and is set in components such as a server during a design of a system. When IP forward is ON, the component relays the IP packet and when OFF, the component does not relay the IP packet.

Furthermore, in a search of search protocol code "POWER," for example, calculating a power supply capacity or the like is assumed to be the search purpose. Therefore, according to this search protocol, set data of functions (power supply, breaker or the like) of the component, set data of power supply specification (power consumption, voltage, number of phases, frequency, interrupting current or the like) or the like are the collected data.

Furthermore, in a search of search protocol code "SAN," for example, checking of connection relations or the like of the storage network area is assumed to be the search purpose. Therefore, according to this search protocol, set data of WWN (World Wide Name), WWPN (World Wide Port Name), zone name, LUN (Logical Unit Number) or the like are the collected data.

In the search matrix 201 in FIG. 5, search code "COMP" is a search code set in the computer or a component derived from the computer. The search codes set in a component such as a server, personal computer and storage is "COMP." Search code "HUB" is a search code set in a component that performs routing at an L2 level. The search code set in a component such as a hub is "HUB." Search code "PCI" is a search code set in a component that performs a protocol conversion in an L1 layer. The search code set in a component such as a PCI card is "PCI." Search code "TERM" is a search code set in a component or the like which is an end of a function, or generally logically component of a parent apparatus. The search code set in a component such a power supply is "TERM." Search code "NFB" is a search code set in a component that allows power to pass. The search code set in a component such as a breaker is "NFB."

The topology processing section 134 acquires topology at the component and search protocol from the correspondence between the search protocol code and search code in the search matrix 201. For example, in the search matrix 201 in FIG. 5, during a search of the search protocol code "IPV4," topology of the component whose search code is "COMP" is topology indicated by topology code "MATRIX" (when IP forward=ON) or topology code "BLOCK" (when IP forward=OFF). Furthermore, during a search of the search protocol code "POWER," topology of the component whose search code is "NFB" is topology indicated by topology code "REPEATER."

The use of such a search matrix 201 facilitates extension of a search purpose or extension of classification of components or the like. To newly add a search purpose, a new search protocol code may be set in the search matrix 201, setting information required be collected may be set with the collected data information and a topology code may be set for each search code. Furthermore, when classification of new components is required for a search, a new search code may be set in the search matrix 201 and a topology code corresponding to each search protocol code may be set.

FIG. 6 illustrates examples of topology. The topology indicated by the topology code acquired in the search matrix 201 allows another interface that can proceed a search from a certain interface of the components to be extracted. Here, three topology examples of topology codes "BLOCK," "MATRIX" and "REPEATER" shown in the search matrix 201 shown in FIG. 5 will be explained.

Models 210, 211 and 212 shown in FIG. 6 denote respective components. Small graphics "a" to "d" denote interfaces of each component. FIG. 6 shows four interfaces for each component, but this is only for illustrative purposes and does not mean that the topology is always made up of four interfaces. Arrows indicate directions in which a search can be proceeded from an interface to another interface.

The shapes of graphics of the interfaces "a" to "d" denote the roles set in the interfaces and a non-filled circle denotes "composite" or "bidirectional," a square denotes "controlled" or "input," a triangle denotes "control" or "output" and a filled circle denotes the role of all the above kinds. The role set in each interface represents the kind of function the interface assumes in the component.

"Controlled" means that the component is controlled from the outside through the interface. "Control" means that the component exerts control over the outside through the interface. "Composite" means that the component is controlled from the outside or exerts control over the outside through the interface. "Input" means that there is an electric input from the outside through the interface. "Output" means that there is an electric output to the outside through the interface. "Bidirectional" means that there are an electric input from the outside and an electric output to the outside through the interface.

The model 210 in FIG. 6 shows an example of topology indicated by the topology code "BLOCK." The topology indicated by the topology code "BLOCK" shows that a search protocol cannot pass through the inside of the component regardless of the roles of the interfaces and means that no search can be proceeded between all the interfaces. For example, topology of components such as a commercial power supply, 10 apparatus corresponds to this "BLOCK."

The model 211 in FIG. 6 is an example of topology indicated by the topology code "MATRIX." The topology indicated by the topology code "MATRIX" shows that a search protocol can pass through the inside of the component regardless of the roles of the interfaces and means that a search is to be proceeded between all the interfaces. For example, topology of components such as a simple HUB or router during a search of a search protocol code "IPV4" is this "MATRIX."

The model 212 in FIG. 6 is an example of topology indicated by the topology code "REPEATER." The topology indicated by the topology code "REPEATER" means that a search is to be proceeded between a "controlled" or "input" interface, "control" or "output" interface and "composite" or "bidirectional" interface. No search can be proceeded in other combinations of roles. For example, the topology of components such as a relay of a power supply is this "REPEATER." A search direction may be fixed to one direction by a definition of topology. In the following embodiment, suppose the search direction is bidirectional for simplicity of explanation.

FIG. 6 shows only simple topology examples, but topology in various structures can be defined by adding further conditions. For example, when there are four interfaces "a" to "d" in a component, if topology that a search can be proceeded only in relations "a-b" and "c-d" is defined, a communication group such as VLAN can be handled. On the other hand, if topology that a search can be proceeded only in relations "a-d," "b-d" and "c-d" is defined, a multiplexer or demultiplexer can be defined.

The definition of topology may be stored in a data format or a processing module may be prepared for each topology. If new topology is required when classification of a new search purpose or new component is set in the search matrix 201, the topology can be easily extended by only adding definition data of new topology or a processing module.

FIG. 7 shows an example of the components property table. The components property table 202 is registration information of components used for a design. The components property table 202 has information such as components model name, search code, function and property.

The "components model name" is identification information set for each components model. The "search code" is a search code set in the component. The "function" is information showing a function of the component. The "property (1, 2, 3 . . . )" is various kinds of setting information set in the component.

In the components property table 202 in FIG. 7, "?" in the information set as the property indicates that this is information set by the designer during a system design. For example, when a component having a components model name "PN-HUB-1" is arranged in the system structure diagram, the designer sets an IP address and a subnet name in the property of the arranged component.

FIG. 8 shows an example of the interface property table. The interface property table 203 is registration information of each interface that belongs to components used for a design. The interface property table 203 has information such as a components model name, interface ID, related protocol, role and property.

The "components model name" is a components model name of the component to which an interface belongs. The "interface ID" is identification information on the interface. The "related protocol" is a search protocol code of a search protocol related to the interface. The "role" is a role set in the interface. The "property (1, 2, 3 . . . )" is various kinds of information set in the interface.

In the interface property table 203 of FIG. 8, "?" in the information set as the property indicates that this is information set by the designer during a system design. For example, when a component having a components model name "PN-SVR-1" is arranged in the system structure diagram, the designer sets an IP address and a subnet name in the property of the interface having interface ID "lan0" of the arranged component.

Examples of system structure diagram designed by the CAD device 300, design information 120 created by the system structure diagram, search management table 135 created from the design information 120 and search result information 140 obtained through a search will be explained using FIG. 9 to FIG. 15.

Figure 9:
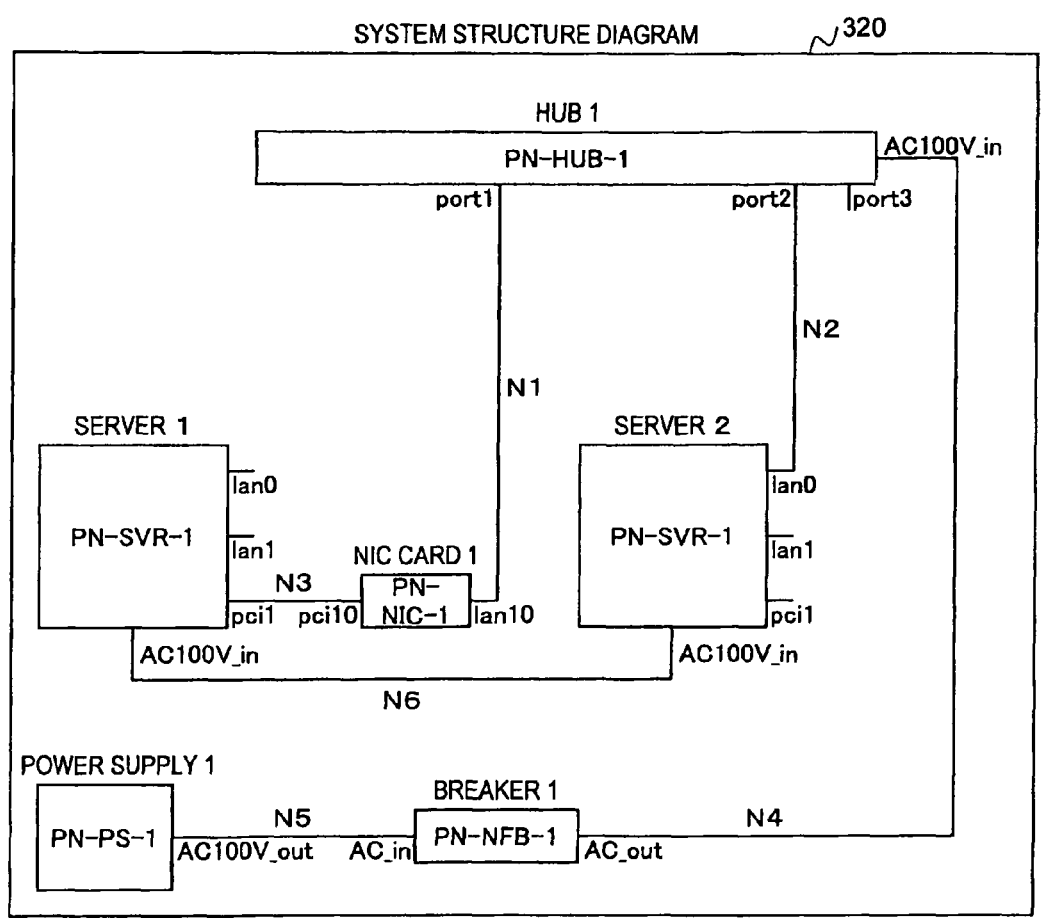
FIG. 9 shows an example of system structure diagram.

FIG. 9 shows an example of the system structure diagram. In the system structure diagram 320 shown in FIG. 9, components of servers (two), hub, NIC card, breaker and power supply are arranged and are connected by nets (N1 to N6) representing connections between interfaces of components having connection relations. Necessary properties are set in the respective components, interfaces and nets.

The design information 120 is created from the system structure diagram 320. The design information 120 is made up of components property information 121, interface property information 122 and netlist information 123 or the like. Examples of the design information 120 shown in FIG. 10 to FIG. 12 below are examples of the design information 120 created based on the system structure diagram 320 shown in FIG. 9.

FIG. 10 shows an example of the components property information. The components property information 121 is property information of components arranged in the system structure diagram 320. The components property information 121 has information such as components ID, components model name, property (1, 2, 3, ... ). The "components ID" is identification information set for each component during a design. The components model name is a components model name set in the stage of registration in the library DB 200. The property (1, 2, 3, ... ) is various kinds of setting information set in the component.

FIG. 11 shows an example of the interface property information. The interface property information 122 is property information on interfaces that belongs to the components arranged in the system structure diagram 320. The interface property information 122 has information such as components ID, interface ID and property (1, 2, 3, ... ). The "components ID" is a components ID of a component to which an interface belongs. The "interface ID" is an interface ID set in the stage of registration in the library DB 200. The property (1, 2, 3, ... ) is various kinds of information set in the interface.

FIG. 12 shows an example of the netlist information. The netlist information 123 is information on nets that connect the interfaces of the components arranged in the system structure diagram 320. The netlist information 123 has information such as a net name, start point components ID, start point interface ID, end point components ID and end point interface ID. The "net name" is identification information of a net set during a design. The "start point components ID" is a components ID of a component to which an interface belongs which was the start point when a net was set. The "start point interface ID" is an interface ID of an interface which was a start point when the net was set. The "end point components ID" is a components ID of a component to which an interface belongs which was an end point when the net was set. The "end point interface ID" is an interface ID of an interface which was an end point when the net was set.

FIG. 13 shows an example of search management table. The search management table 135 shown in FIG. 13 is a search management table 135 created based on the design information 120 (components property information 121) or the like shown in FIG. 10. The search management table 135 in FIG. 13 is in an initialized state.

The search management table 135 is made up of information such as a components ID, components model name, interface ID, search target flag and search completion flag. As shown in FIG. 13, the search management table 135 provides records of interfaces of the respective components arranged in the system structure diagram 320. The components ID, components model name and interface ID are information extracted from the design information 120.

The search target flag is information indicating whether or not each interface is to be searched. All flags are set to "unknown" in an initialized state. When the search protocol is determined, "target" is set in the interface which is to be searched in the search protocol and "non-target" is set in the interface which is not to be searched.

The search completion flag is information indicating whether or not a search of the interface has already completed, that is, whether or not the setting information on the interface has already been collected. "Unsearched" indicates that the interface has not been searched yet and "Completed" indicates that the interface has already been searched or need not be searched. All the flags are "unsearched" in an initialized state.

FIG. 14 and FIG. 15 show examples of search result information. The search result information 140 in FIG. 14 and FIG. 15 are examples of search results of the system structure diagram 320 shown in FIG. 9. FIG. 14 is search result information 140a when a search is performed with a search protocol code "POWER" and FIG. 15 is search result information 140b when a search is performed with a search protocol code "IPV4."

The search result information 140 is made up of information such as a search net number, components ID, interface ID, function and property (1, 2, 3, ... ). The search net number is a number assigned to each group of connection relations that can be traced from a certain component. The same number is assigned as the search net numbers of all components and interfaces that can be traced from a component from which a search is started. Whether or not relations can be traced in the components is determined from the topology obtained by the search matrix 201 from the search protocol code and search code.

The components ID and interface ID are IDs of components and interfaces whose setting information is collected through a search. Records without interface IDs are records of setting information of the components and records with interface IDs are records of setting information on the interfaces. The function and property (1, 2, 3, ... ) are setting information collected from the design information 120, components property table 202, interface property table 203 or the like through a search.

Next, examples of setting information collecting processing by the setting information collection unit 103 and configuration testing processing by the configuration testing unit 109 according to the present embodiment will be explained using FIG. 16 to FIG. 22.

Figure 16:
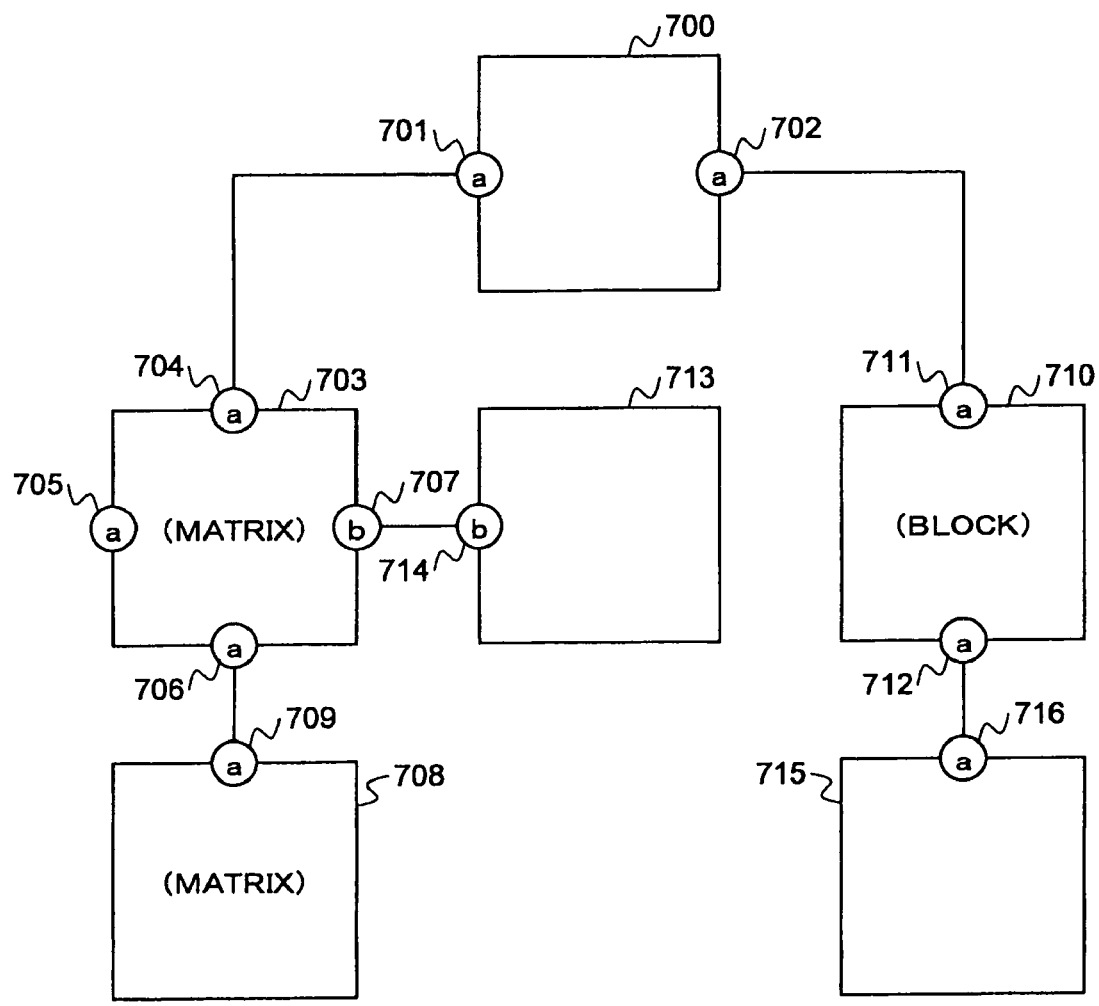
FIG. 16 illustrates the way a search is proceeded according to the present embodiment.

FIG. 16 illustrates the way a search is proceeded according to the present embodiment. First, before explaining a flow of the setting information collecting processing by the setting information collection unit 103 of the present embodiment, the way a search is proceeded according to the present embodiment will be explained. There can be many methods for proceeding a search, but a simple example will be explained here. Square boxes in FIG. 16 denote components. Circles denote interfaces and alphabetic characters in the circles denote search protocols set in the interfaces. Suppose interfaces linked by lines have connection relations with each other.

First of all, a search protocol is determined. Here, suppose a search is performed with a search protocol a. Next, a component from which a search is started is selected. Finally, since searches are performed on all components, a search can be started from any component. Here, suppose a search is started from a component 700. Suppose the search net number of the search that starts from the component 700 is 1.

Suppose topology will not be acquired for the component from which a search is started. That is, the topology of the component 700 is not acquired. Since the component 700 has interfaces to be searched, that is, an interface 701 and an interface 702 in which the search protocol a is set, the setting information of the component 700 is collected.

The search protocol a is set in both the interface 701 and interface 702 that belong to the component 700. Therefore, the setting information on the interface 701 and interface 702 needs to be collected. Here, the setting information on the interface 701 is collected first.

When the connection relations of the interface 701 from which the setting information has been collected are traced, the tracing reaches an interface 704 that belongs to a component 703. Since the search protocol of the interface 704 is a, the setting information on the interface 704 is collected. Furthermore, since the component 703 has an interface in which the search protocol a is set, the setting information of the component 703 is collected.

Next, the topology of the component 703 is acquired. Here, suppose topology having a topology code "MATRIX" is acquired. Since the acquired topology is "MATRIX," a search may be proceeded to any interface from the interface 704 passing through the inside of the component 703.

There are four interfaces that belong to the component 703: interface 704, interface 705, interface 706 and interface 707. Of these interfaces, a search has already been completed for the interface 704. Furthermore, since the search protocol set in the interface 707 is b, the interface 707 is a not to be searched this time. The search protocol set in the interface 705 and interface 706 is a. Therefore, the setting information on the interface 705 and interface 706 need to be collected. First, the setting information on the interface 705 is collected. Since no connection relations are set in the interface 705, further tracing is not necessary.

The setting information of the remaining interface 706 is collected. When the connection relations of the remaining interface 706 are traced, the tracing reaches an interface 709 of a component 708. Since the search protocol of the interface 709 is a, the setting information on the interface 709 is collected. Furthermore, since the component 708 has the interface 709 in which the search protocol a is set, the setting information of the component 708 is collected.

Next, the topology of the component 708 is acquired. Here, suppose topology having a topology code "MATRIX" is acquired. Since the acquired topology is "MATRIX," a search may be proceeded to any interface from the interface 709 passing through the inside of the component 708. However, since there is no interface other than the interface 709 in the component 708 where the search has already been completed, the search in this system ends here.

The connection relations are traced back to the component 703 from the interface 709. Returning to the component 703, a search is conducted for any interface belonging to the component 703, which has not been searched yet. However, since the searches of the interface 704, interface 705 and interface 706 belonging to the component 703 have already been completed and the search protocol of the interface 707 is not a, the search in this system ends here.

The connection relations are traced back to the component 700 from the interface 704. Returning to the component 700, a search is conducted for an interface belonging to the component 700, which has not been searched yet. Since the interface 702 having a search protocol a has not been searched yet, the setting information on the interface 702 is collected. When the connection relations of the interface 702 are traced, the tracing reaches an interface 711 of a component 710. Since the search protocol of the interface 711 is a, the setting information on the interface 711 is collected. Furthermore, since the component 700 has the interface 711 in which the search protocol a is set, the setting information of the component 710 is collected.

Next, the topology of the component 710 is acquired. Here, suppose the topology having a topology code "BLOCK" is acquired. Since the acquired topology is "BLOCK," any search that passes through the inside of the component 710 from the interface 711 cannot be conducted. Although the search protocol set in the interface 712 that belongs to the component 710 is a, any search that passes through the inside of the component 710 cannot be conducted, and therefore the setting information on the interface 712 is not collected here. Since the topology of the component 710 is "BLOCK," the search in this system ends here.

The connection relations are traced back to the component 700 from the interface 711. Since the searches of the interface 701 and interface 702 that belong to the component 700 which is the component from which the search was started have already been completed, the search of search net number 1 ends.

A component from which the next search is started is selected. In the example of FIG. 16, there are three interfaces where no search has been conducted yet: an interface 712 of the component 710, an interface 714 of a component 713 and an interface 716 of a component 715. Of these interfaces, since a search protocol b is set in the interface 714, the interface 714 is not to be searched this time. The component 713 having only the interface 714 which is not to be searched is a component not to be searched. Therefore, the component from which a search is started is any one of the component 710 and component 715. Here, suppose the search is started from the component 715. Suppose the search net number of the search that is started from the component 715 is 2.

Suppose no topology is acquired for the component from which a search is started. That is, the topology of the component 715 is not acquired. Since the component 715 has an interface to be searched, that is, the interface 716 in which the search protocol a is set, the setting information of the component 715 is collected. Since the search protocol a is set in the interface 716 which belongs to the component 715, the setting information on the interface 716 is collected.

When the connection relations of the interface 716 are traced, the tracing reaches the interface 712 of the component 710. Since the search protocol of the interface 712 is a, the setting information on the interface 712 is collected. The component 710 has the interface 712 in which the search protocol a is set, but since the setting information has already been collected, the setting information of the component 710 is not collected here.

Next, the topology of the component 710 is acquired. Here, the topology having a topology code "BLOCK" is acquired. Since the acquired topology is "BLOCK," no search that passes through the inside of the component 710 from the interface 712 can be conducted. The search in this system ends here.

The connection relations are traced back to the component 715 from the interface 712. Since the search of the interface 716 that belongs to the component 715 which is the component from which the search was started has already been completed, the search of search net number 2 ends. Since there is no remaining interface which has not been searched yet as of this point in time, all searches of search protocols a are ended.

Figure 17:
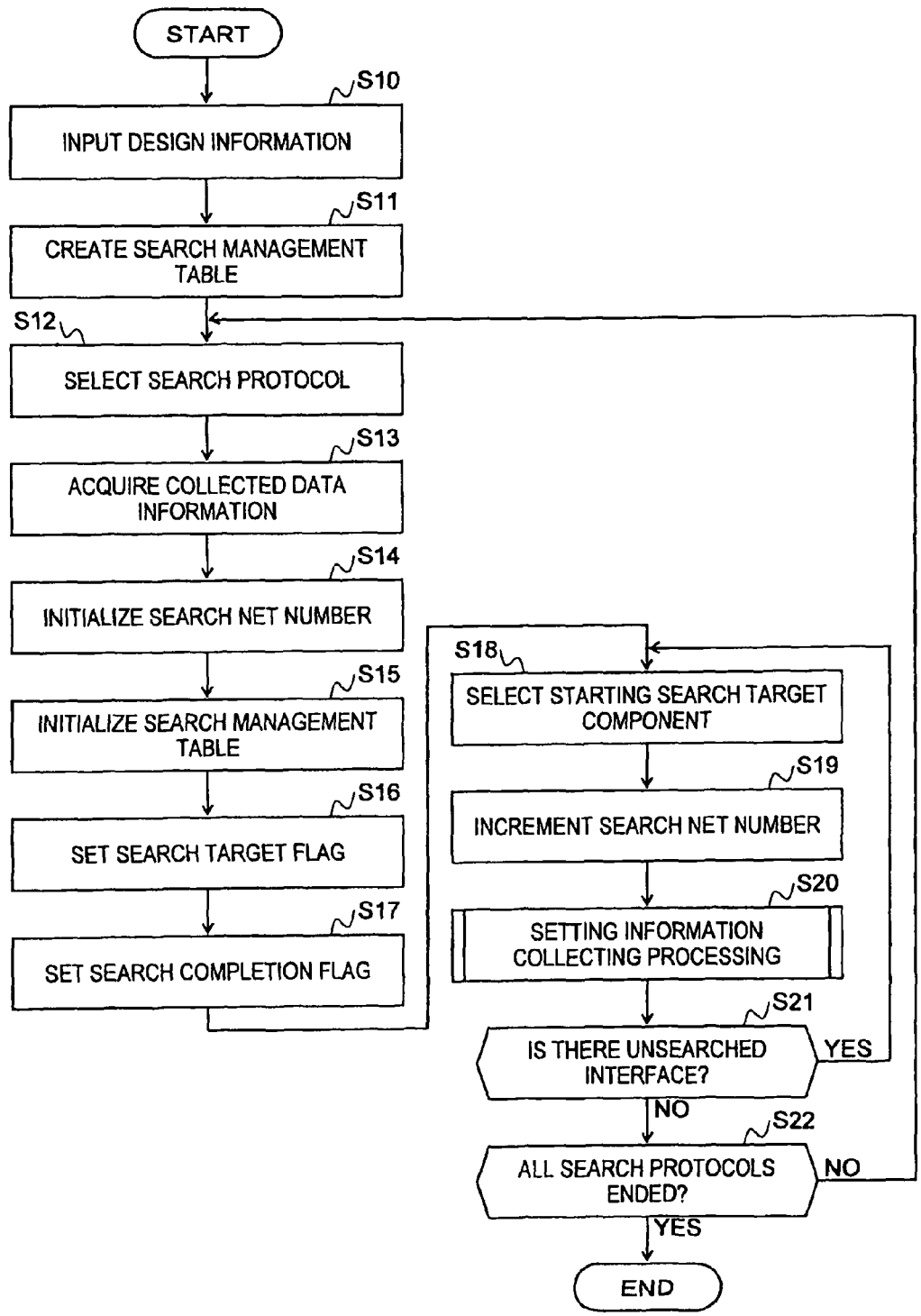
FIG. 17 is a search management processing flowchart by the setting information collection unit.

FIG. 17 is a search management processing flowchart by the setting information collection unit. When the design information 120 is inputted to the setting information collection unit 103 (step S10), the search management processing section 130 creates a search management table 135 from the design information 120 (step S11).

A search protocol is selected (step S12). In the selection of a search protocol, for example, one search protocol defined in the search matrix 201 is automatically selected in order of records. The user may be asked to specify search protocols that need to be searched and a search may be performed sequentially for one specified search protocol at a time.

As for the selected search protocol, the search matrix 201 is looked up with the search protocol code and collected data information according to the search protocol is acquired (step S13). The search net number is initialized to 0 (step S14).

The search management table 135 is initialized (step S15). To be more specific, search target flags of all records of the search management table 135 are set to "unknown" and search completion flags of all records are set to "unsearched."

A search target flag is set in each record of the search management table 135 (step S16). To be more specific, the interface property table 203 of the library DB 200 is looked up for each record of the search management table 135 with the components model name and interface ID and a related protocol set in the interface is acquired. If the acquired related protocol is the search protocol code of the current search protocol, the search target flag becomes "target" and if the acquired related protocol is not the search protocol code of the current search protocol, the search target flag becomes "non-target."

For the interfaces whose search target flag is "non-target," "completed" is set in the search completion flag (step S17). Since the setting information need not be collected for the interfaces which are not the search targets, such an interface is set in a state of having already been searched from the beginning.

A component to be searched from which to start is selected (step S18). In the selection of a component to be searched from which to start, for example, one component having an interface whose search target flag is "target" and whose search completion flag is "unsearched" is selected in order of records of the search management table 135. The user may be asked to select one interface whose search target flag is "target" and whose search completion flag is "unsearched." Since all components are eventually searched, it does not matter from which component a search is started. The search net number is incremented (step S19).

Setting information collecting processing by the setting information collecting processing section 131 is performed (step S20). The setting information collecting processing will be described later.

Whether or not there is any unsearched interface (interface whose search completion flag is "unsearched") is checked with the search management table 135 (step S21), and if there is any unsearched interface, the process returns to the processing in step S18.

Whether or not searches on all necessary search protocols have ended is checked (step S22), and if there is any search protocol which has not been searched yet, the process returns to the processing in step S12. If searches on all necessary search protocols have ended, the search management processing is ended.

Figure 18:
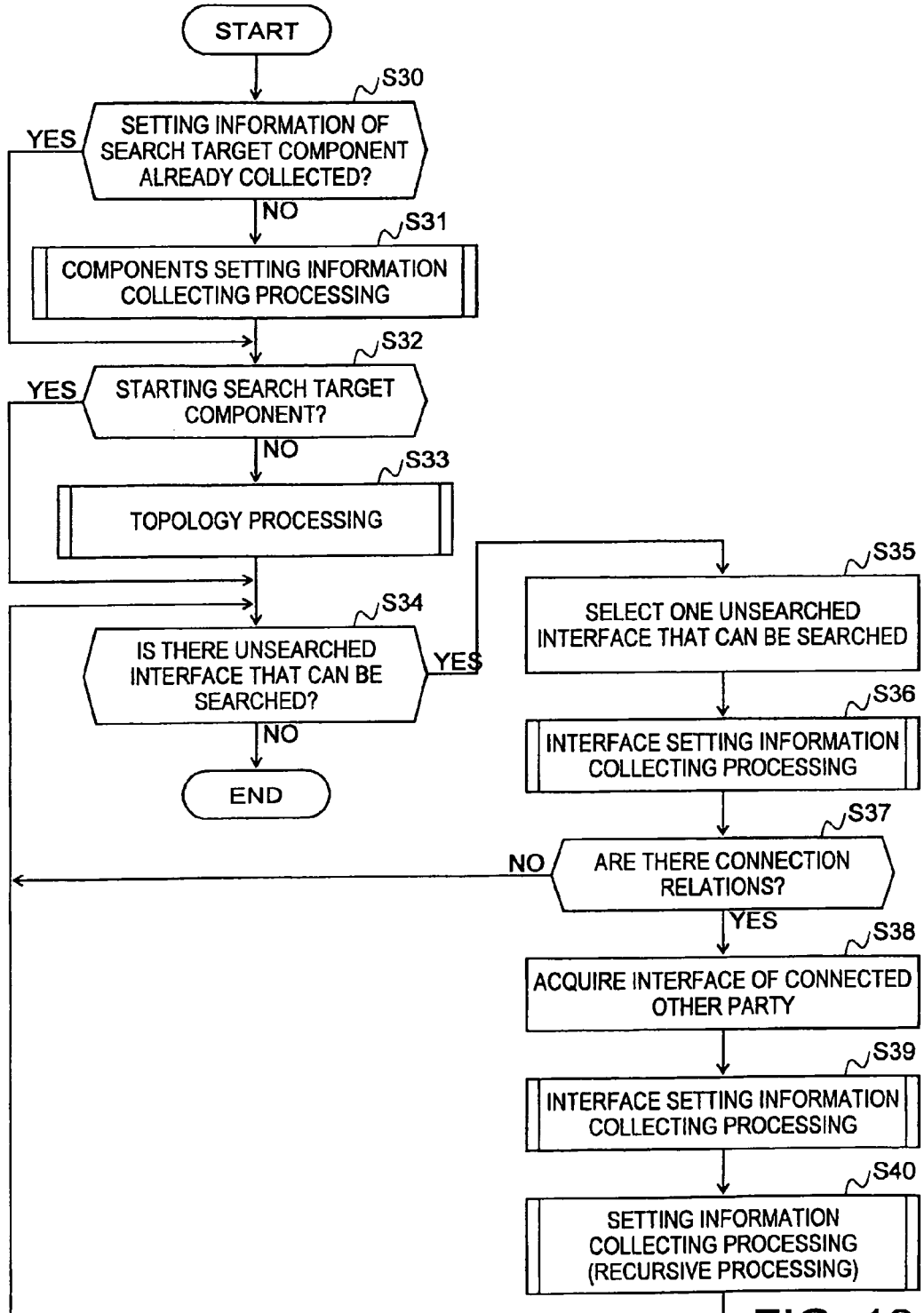
FIG. 18 is a setting information collecting processing flowchart by the setting information collection unit.

FIG. 18 is a setting information collecting processing flowchart by the setting information collection unit. The setting information collecting processing section 131 looks up the search result information 140 of the current search protocol and if the setting information of the current component to be searched has not been collected yet (step S30), the components setting information collecting processing by the components setting information collecting processing section 132 is performed (step S31). The components setting information collecting processing will be described later. Furthermore, if the current component to be searched is not the component from which to start (step S32), topology processing by the topology processing section 134 is performed (step S33). The topology processing will be described later.

The search management table 135 is looked up and if there is no interface which is unsearched and which can be searched among the components to be searched (step S34), the processing is ended.

If there is any unsearched searchable interface among the components to be searched (step S34), one unsearched searchable interface is selected (step S35), the selected interface is assumed to be an interface to be searched and subjected to interface setting information collecting processing by the interface setting information collecting processing section 133 (step S36). The interface setting information collecting processing will be described later. When the current component to be searched is the component from which a search is started, an interface which belongs to the current component to be searched, whose search target flag in the search management table 135 is "target" and whose search completion flag is "unsearched" becomes the searchable interface.

The netlist information 123 of the design information 120 is looked up with the components ID of the current component to be searched and the interface ID of the interface to be searched and if there are no connection relations in the current interfaces to be searched (step S37), the process returns to the processing in step S34.

If there are connection relations in the current interface to be searched (step S37), information (components ID, interface ID) of the interface of the connected other party of the current interface to be searched is acquired from the netlist information 123 of the design information 120 (step S38). The acquired interface of the connected other party is assumed to be a new interface to be searched and interface setting information collecting processing by the interface setting information collecting processing section 133 is carried out (step S39). The interface setting information collecting processing will be described later.

The setting information collecting processing is recursively executed where the component to which the interface which has become the new interface to be searched belongs is assumed as the component to be searched (step S40). The process returns to the processing in step S34.

Figure 19:
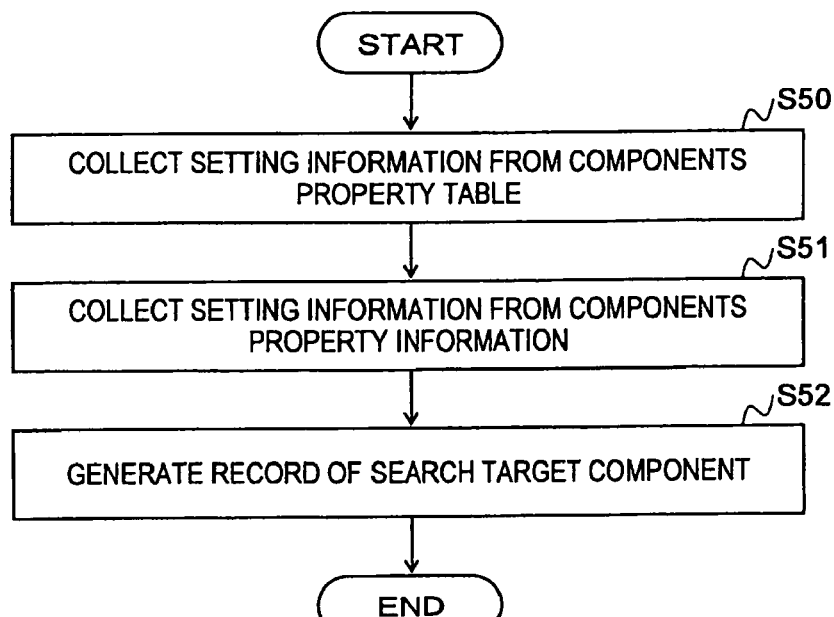
FIG. 19 is a components setting information collecting processing flowchart by the setting information collection unit.

FIG. 19 is a components setting information collecting processing flowchart by the setting information collection unit. The components setting information collecting processing section 132 looks up the components property table 202 of the library DB 200 with the components model name of the current component to be searched and collects the setting information specified by the collected data information (step S50). Furthermore, the components property information 121 of the design information 120 is looked up with the components ID of the current component to be searched and the setting information specified by the collected data information is collected (step S51).

A record of the current component to be searched is created in the search result information 140 of the current search protocol (step S52). To be more specific, a record made up of a current search net number, components ID of the component to be searched and collected setting information or the like is created and added to the search result information 140 of the current search protocol.

Figure 20:
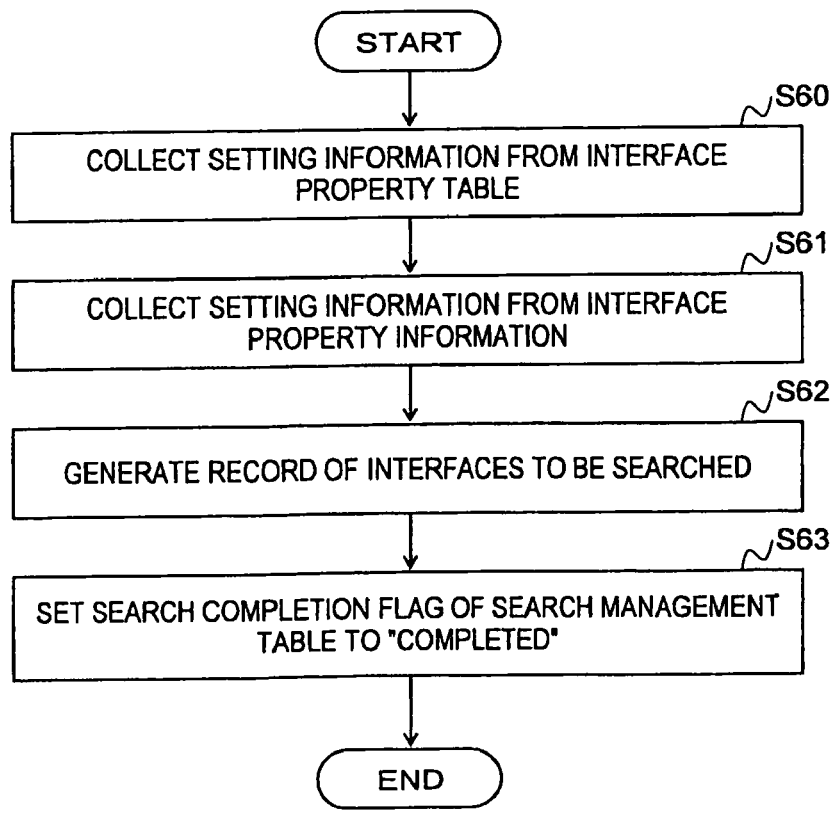
FIG. 20 is an interface setting information collecting processing flowchart by the setting information collection unit.

FIG. 20 is an interface setting information collecting processing flowchart by the setting information collection unit. The interface setting information collecting processing section 133 looks up the interface property table 203 of the library DB 200 with the components model name and interface ID of the current interface to be searched and collects the setting information specified by the collected data information (step S60). Furthermore, the interface property information 122 of the design information 120 is looked up with the components ID and interface ID of the current interface to be searched and the setting information specified by the collected data information is collected (step S61). The correspondence between the components ID and components model name can be obtained from the search management table 135.

A record of the current interface to be searched is created in the search result information 140 of the current search protocol (step S62). To be more specific, a record made up of the current search net number, components ID of the interface to be searched, interface ID, collected setting information or the like is created and added to the search result information 140 of the current search protocol. The search completion flag of the corresponding interface of the search management table 135 is set to "completed" (step S63).

Figure 21:
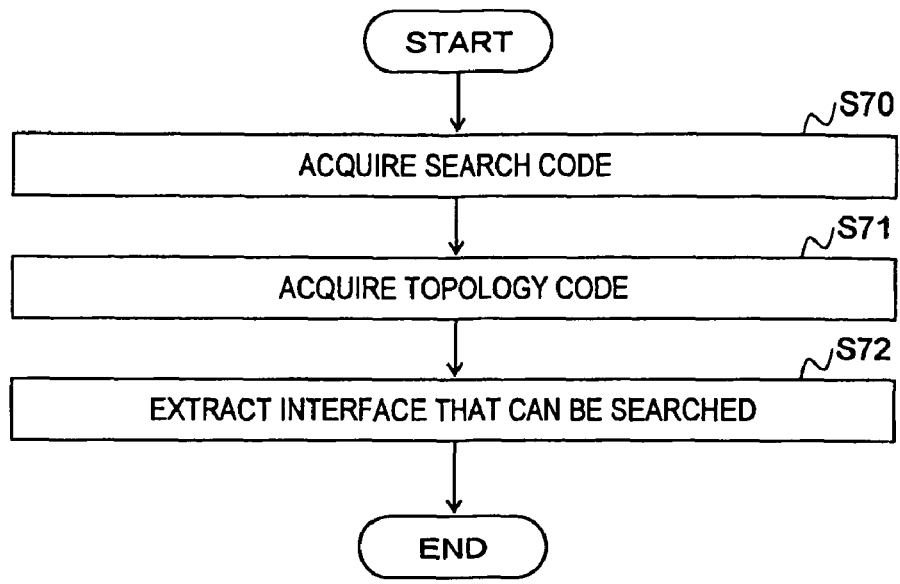
FIG. 21 is a topology processing flowchart by the setting information collection unit.

FIG. 21 is a topology processing flowchart by the setting information collection unit. The topology processing section 134 looks up the components property table 202 of the library DB 200 with the components model name of the current component to be searched and acquires a search code (step S70). The topology processing section 134 looks up the search matrix 201 of the library DB 200 with the acquired search code and current search protocol code and acquires a topology code (step S71).

A searchable interface is extracted from the interface that belongs to the current component to be searched (step S72). To be more specific, an interface is extracted from among the interfaces that belong to the current component to be searched, whose search target flag of the search management table 135 is "target," whose search completion flag of the search management table 135 is "unsearched" and whose search can be proceeded by a judgment according to the topology of the acquired topology code.

Figure 22:
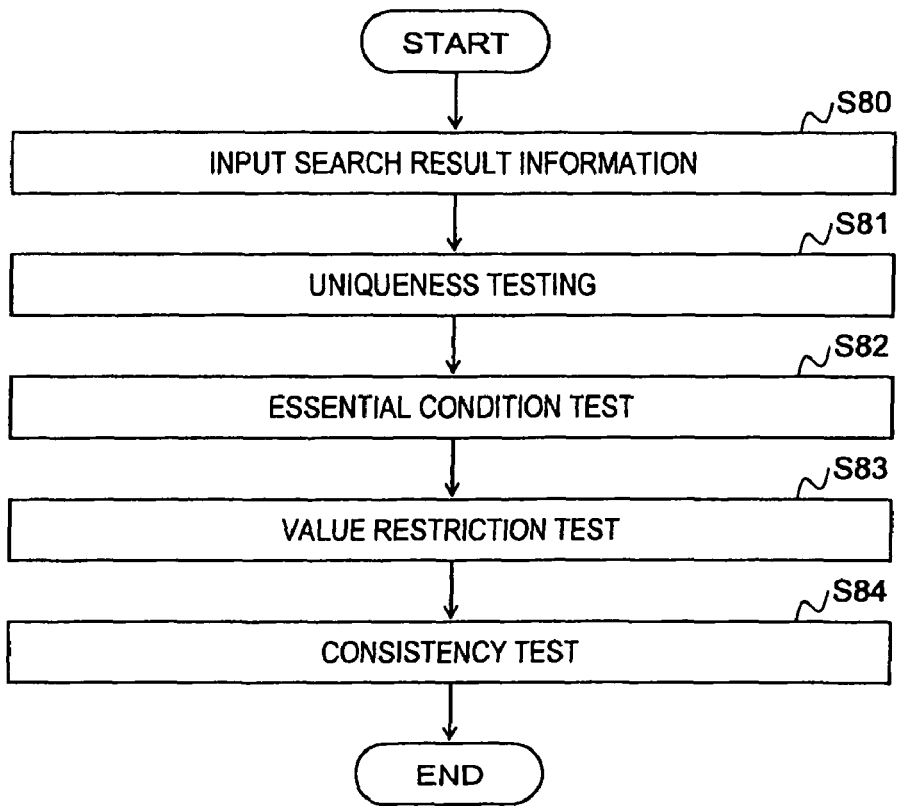
FIG. 22 is a configuration testing processing flowchart by the configuration testing unit.

FIG. 22 is a configuration testing processing flowchart by the configuration testing unit. Here, an example will be explained where the aforementioned uniqueness test, essential condition test, value restriction test and consistency test are conducted. First, the configuration testing unit 109 inputs the search result information 140 for each search purpose from the setting information collection unit 103 (step S80). A setting information document created by the setting information document creation unit 106 may also be inputted.

A uniqueness test is conducted when necessary (step S81). For example, it is tested whether or not there is any component or interface that belongs to the same search net number using the search result information 140b according to the search protocol having search protocol code "IPV4" shown in FIG. 15 in which the same IP address is set. There are a variety of uniqueness testing targets, but since a procedure for checking the required uniqueness about the collected setting information is a design-related item and can be easily executed, detailed explanations of the procedure will be omitted.

An essential condition test is conducted when necessary (step S82). For example, it is tested whether or not there is a power supply for each search net number using the search result information 140a according to the search protocol having the search protocol code "POWER" shown in FIG. 14. Furthermore it is tested whether or not there are two or more components or interfaces that belong to the same search net number in which IP addresses are set using, for example, the search result information 140b according to the search protocol having the search protocol code "IPV4" shown in FIG. 15. Since such an essential condition test can also be easily conducted based on the above collected setting information, detailed explanations of the specific procedure will be omitted.

A value restriction test is conducted when necessary (step S83). It is tested whether or not $\Sigma$power consumption/voltage<interrupting current using, for example, the search result information 140a according to the search protocol having the search protocol code "POWER" shown in FIG. 14. Such a value restriction test can be automatically and easily conducted from the search result information 140a.

A consistency test is conducted when necessary (step S84). An inclusion relation between conditions such as voltage, frequency, number of phases set in components in each apparatus and conditions of power supplied using, for example, the search result information 140a according to the search protocol having the search protocol code "POWER" shown in FIG. 14 is tested. Furthermore, it is tested whether or not net masks of IP addresses match within the same search net number using, for example, the search result information 140b according to the search protocol having the search protocol code "IPV4" shown in FIG. 15. Such a program for a consistency test needs to be created for each testing content of consistency, but it is easy to create a program for a conducting consistency test by looking up the search result information 140 or setting information document or design-related document 600.

Next, a flow of processing until the search result information 140a shown in FIG. 14 and search result information 140b shown in FIG. 15 are obtained from the system structure diagram 320 shown in FIG. 9 will be explained using a specific example. FIG. 23 to FIG. 25 show examples of search management table in the search process.

First, the design information 120 shown in FIG. 10 to FIG. 12 is generated based on the system structure diagram 320 shown in FIG. 9. The search management table 135 shown in FIG. 13 is generated from the generated design information 120.

A search protocol is selected. Here, a search of search protocol code "POWER" and a search of search protocol "IPV4" need to be conducted and suppose the search protocol having the search protocol code "POWER" is selected first. The search matrix 201 shown in FIG. 5 is looked up with the search protocol "POWER" and the collected data information where a function and power supply specification are specified is acquired. The search net number is initialized to 0.

The search management table 135 is initialized. The search management table 135 when just generated is in an initialized state, and therefore the search management table 135 may not dare to be initialized. In this stage, the search management table 135 is in the initialized state as shown in FIG. 13.

The interface property table 203 shown in FIG. 8 is looked up for each record of the search management table 135 with the components model name and interface ID and the set related protocol is checked. The search target flag of the interface for which the search protocol code "POWER" of the current search protocol is set in the related protocol is set to "target" and the search target flag of the interface for which the search protocol code "POWER" of the current search protocol is not set in the related protocol is set to "non-target." Furthermore, the search completion flag of the record whose search target flag is "non-target" is set to "completed." In this stage, the search management table 135 is in the state shown in FIG. 23.

A starting component to be searched is selected. Here, in the search management table 135 shown in FIG. 23, of records whose search target flag is "target" and whose search completion flag is "unsearched," the component of the top record, that is, the component having components ID "server 1" is assumed to be the starting component to be searched. The search net number is incremented to 1.

The setting information of the component of components ID "server 1" is collected and a record of the search result information 140 is generated. That is, the components property table 202 shown in FIG. 7 and the components property information 121 shown in FIG. 10 are looked up using the components ID "server 1" and components model name "PN-SVR-1" and the function specified by the collected data information and setting information corresponding to the power supply specification are collected if any and recorded in a record of the search result information 140.

Since topology processing is not performed on the starting component to be searched, the interface having interface ID "AC100V_in" which is an interface belonging to the component having components ID "server 1" in the search management table 135, whose search target flag is "target" and whose search completion flag is "unsearched" becomes the searchable interface.

The setting information is collected using the interface having interface ID "AC100V_in" of the component having components ID "server 1" as the interface to be searched and a record of the search result information 140 is generated. That is, the interface property table 203 shown in FIG. 8 and the interface property information 122 shown in FIG. 11 are looked up using the components ID "server 1," components model name "PN-SVR-1" and interface ID "AC100 V_in," the setting information corresponding to the function and power supply specification specified by the collected data information is collected if any and recorded in a record of the search result information 140. The search management table 135 sets the search completion flag of a record whose components ID is "server 1" and whose interface ID is "AC100V_in" to "completed."

The netlist information 123 shown in FIG. 12 is looked up with components ID "server 1" and interface ID "AC100V_in," and components ID "server 2" and interface ID "AC 100V_in" of the interface of the connected other party are acquired. The setting information is collected using the interface having interface ID "AC100 V_in" of the component of components ID "server 2" as the interface to be searched and a record of the search result information 140 is generated. In the search management table 135, the search completion flag of a record whose components ID is "server 2" and whose interface ID is "AC100 V_in" is set to "completed." The process moves to the processing on the component having components ID "server 2."

The setting information on the component having components ID "server 2" is collected and a record of the search result information 140 is generated. The components property table 202 shown in FIG. 7 is looked up with components model name "PN-SVR-1" of the component of components ID "server 2" and search code "COMP" is acquired. Furthermore, the search matrix 201 shown in FIG. 5 is looked up with the search protocol code "POWER" of the current search protocol and acquired search code "COMP" and a topology code "BLOCK" is acquired.

Since the acquired topology code is "BLOCK," no search can be proceeded inside the component of components ID "server 2" as shown in the model 210 in FIG. 6. That is, the search of the component of the components ID "server 2" ends here. The process returns to the processing on the component having components ID "server 1."

In the search management table 135, since all search completion flags of the searchable interface of the component having components ID "server 1" which is the starting component to be searched are "completed," the search of the system of the search net number 1 ends. The search management table 135 as of this point in time is in the state shown in FIG. 24.

The next starting interface to be searched is selected. Here, in the search management table 135 shown in FIG. 24, of the records whose search target flag is "target" and whose search completion flag is "unsearched," the component of the top record, that is, the component having components ID "hub 1" is assumed to be the starting component to be searched. The search net number is incremented to 2.

Processing similar to that for the system of search net number 1 is also applied to the system of search net number 2, setting information of the component of components ID "hub 1," interface of interface ID "AC100 V_in" of the component of components ID "hub 1," interface of interface ID "AC_out" of the component of components ID "breaker 1," component of components ID "breaker 1," interface of interface ID "AC_in" of the component of components ID "breaker 1," interface of interface ID "AC100 V_out" of the component of components ID "power supply 1" and the component of components ID "power supply 1" is collected and respective records of the search result information 140 are generated. Here, the search of the system of search net number 2 ends.

Since all search completion flags of the search management table 135 are "completed" as of this point in time, the search of the search protocol code "POWER" ends. The search result information 140 through the search of the search protocol code "POWER" is like the search result information 140a shown in FIG. 14.

Since all the necessary searches have not been completed yet, the next search protocol is selected. Here, suppose a search protocol of the remaining search protocol code "IPV4" is selected. The search matrix 201 shown in FIG. 5 is looked up with the search protocol "IPV4" and the collected data information in which the IPV4 setting and IP forward are specified is acquired. The search net number is initialized to 0.

The search management table 135 is initialized. The search management table 135 is in an initialized state shown in FIG. 13. For each record of the search management table 135, the interface property table 203 shown in FIG. 8 is looked up with the components model name and interface ID and the set related protocol is checked. Suppose the search target flag of the interface for which the search protocol code "IPV4" of the current search protocol is set in the related protocol is set to "target" and the search target flag of the interface for which the search protocol code "IPV4" of the current search protocol is not set in the related protocol is set to "non-target." Furthermore, suppose the search completion flag of a record whose search target flag is "non-target" is set to "completed." The search management table 135 is set in the state shown in FIG. 25 at this stage.

Hereinafter, processing similar to that of the search of search protocol code "POWER" is performed and the search result information 140b shown in FIG. 15 is obtained. Since there is no further necessary search, the processing is ended.

A configuration test is conducted based on the acquired search result information 140. First, a configuration test on the search result information 140a shown in FIG. 14 is conducted first. When an essential condition test is conducted on the search result information 140a, since no power supply is set in the system of search net number 1, error information indicating that fact is outputted. When a value restriction test is conducted on the search result information 140a, power consumption 100 W/voltage 100 V of the hub 1=1 A, which is smaller than interrupting current 30 A of the breaker 1, and therefore the system of search net number 2 is judged to have no problem. When a consistency test is conducted on the search result information 140a, the conditions of voltage required by the hub 1, frequency, the number of phases and the conditions of voltage supplied by the power supply 1, frequency and the number of phases satisfy an inclusion relation, and therefore the system of search net number 2 is judged to have no problem. For the search result information 140a shown in FIG. 14, the above configuration testing result is outputted.

Next, a configuration test is conducted on the search result information 140b shown in FIG. 15. When a uniqueness test is conducted on the search result information 140b, since the same IP address does not exist in the system of search net number 1, the system of search net number 1 is judged to have no problem. When an essential condition test is conducted on the search result information 140b, since three IP addresses are set in the system of search net number 1, the system of search net number 1 is judged to have no problem. When a consistency test is conducted on the search result information 140b, since net masks of IP addresses in the system of search net number 1 match, the system of search net number 1 is judged to have no problem. The following configuration testing result is outputted for the search result information 140b shown in FIG. 15.

When the search result information 140 and the configuration testing result are delivered to the setting information document creation unit 106 shown in FIG. 3, the setting information document creation unit 106 creates a setting information document that compiles the necessary information into a human-readable format.

FIG. 26 shows an example of an IP address list. For example, the setting information document creation unit 106 compiles the information on IP addresses of the search result information 140b shown in FIG. 15 and creates an IP address list 150 as shown in FIG. 26. Operators such as SE can simply perform operation of setting IP addresses by seeing such an IP address list 150 in the field.

The embodiment of the present invention has been explained so far, but the present invention is not limited to this. For example, the logical of the way a search is proceeded is not limited to the logical illustrated by the present embodiment.

By only specifying setting information to be collected for each search purpose and setting topology for each combination between a search purpose and component classification, the present invention can collect setting information related to a designed system structure diagram for each search purpose, and can thereby easily collect setting information for efficiently testing a system structure diagram of a computer where many interfaces are mixed without the need to prepare any complicated program.

Furthermore, when adding a new item for testing the system structure diagram, the present invention needs only to specify collected setting information and make a topology setting for each combination between a search purpose and component classification, and can thereby easily extend the system structure diagram.

Furthermore, even when creating a diagram for an actual system operator or system construction operator, the present invention can make it easier to collect setting information according to the operation purpose.

The present invention is a technique effective in verifying settings of a system structure diagram designed by CAD or the like, detecting setting errors, creating information compiled for each of various kinds of system installation operations in the field or the like.

All examples and conditional language recited herein are intended for pedagogical purposes to aid the reader in understanding the invention and the concepts contributed by the inventor to furthering the art, and to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A setting checking information collecting method for a computer to search a system structure diagram and collect information necessary for checking setting information according to search purposes based on electronic information of the system structure diagram comprising information on components, interface connection information between the components and property information set therein, the method comprising:

a step of inputting the system structure diagram and determining, for each of the search purposes, one component in the system structure diagram as a search starting component according to each search purpose stored in a search controlling information storing unit that stores information indicating data to be collected and topology information indicating whether or not a search is to be proceeded between interfaces in the components for each component or classification information thereof or a search direction or a search purpose specified from outside;

a step of looking up a components/interface information storing unit in which information on the components used in the system structure diagram, information on interfaces of the components, information indicating relations between the interfaces and search purposes are registered beforehand sequentially starting from the search starting component, obtaining an interface that belongs to a component to be searched, looking up the search controlling information storing unit and determining an interface for which a search is to be proceeded according to the search purpose from among the interfaces;

a step of likewise repeating a search for components connected to the interfaces for which the search is to be proceeded as new search targets and extracting information on the respective searched components or information on the interfaces or setting information of property information set therein defined as data to be collected by the search controlling information storing unit from the electronic information of the system structure diagram; and a step of forming the extracted setting information into a file and outputting the file.

2. The setting checking information collecting method according to claim 1, further comprising a step of testing, based on the collected setting information, excess or deficiency or consistency of the setting information and outputting the testing result.

3. A setting checking information collecting device that collects, based on electronic information of a system structure diagram comprising information on components, interface connection information between the components and property information set therein, information necessary for checking the setting information by searching the system structure diagram according to search purposes, the device comprising:

a search controlling information storing unit that stores, for each of the search purposes, information indicating data to be collected and topology information indicating whether or not a search is to be proceeded between interfaces in the components for each component or classification information thereof or a search direction;

a components/interface information storing unit which information on the components used in the system structure diagram, information on the interfaces of the respective components and information indicating relations between the interfaces and search purposes are registered beforehand;

a unit that inputs the system structure diagram and determines one component in the system structure diagram as a search starting component according to a search purpose specified from outside or each search purpose stored in the search controlling information storing unit;

a unit that looks up the components/interface information storing unit sequentially starting from the search starting component, obtains an interface that belongs to the component to be searched, looks up the search controlling information storing unit and determines an interface for which a search is to be proceeded according to the search purpose in the interface;

a setting information collecting unit that likewise repeats a search for components connected to the interfaces for which the search is to be proceeded as new search targets and extracts information on the respective searched components or information on the interfaces or setting information of property information set therein defined as data to be collected by the search controlling information storing unit from the electronic information of the system structure diagram; and a setting information output unit that forms the extracted setting information into a file and outputs the file.

4. The setting checking information collecting device according to claim 3, further comprising a configuration testing unit that executes processing of testing, based on the collected setting information, excess or deficiency or consistency of the setting information and outputs the testing result.

5. A recording medium that records a setting checking information collecting program for causing a computer to execute processing of collecting, based on electronic information of a system structure diagram comprising information on components, interface connection information between the components and property information set therein, information necessary for checking the setting information by searching the system structure diagram according to search purposes, the recording medium that records setting checking information collecting program causing the computer to execute:

inputting the system structure diagram and determining, for each of the search purposes, one component in the system structure diagram as a search starting component according to each search purpose stored in a search controlling information storing unit that stores information indicating data to be collected and topology information indicating whether or not a search is to be proceeded between interfaces in the components for each component or classification information thereof or a search direction or a search purpose specified from outside;

looking up a components/interface information storing unit in which information on the components used in the system structure diagram, information on interfaces of the components, information indicating relations between the interfaces and search purposes are registered beforehand sequentially starting from the search starting component, obtaining an interface that belongs to a component to be searched, looking up the search controlling information storing unit and determining an interface for which a search is to be proceeded according to the search purpose from among the interfaces;

likewise repeating a search for components connected to the interfaces for which the search is to be proceeded as new search targets and extracting information on the respective searched components or information on the interfaces or setting information of property information set therein defined as data to be collected by the search controlling information storing unit from the electronic information of the system structure diagram; and forming the extracted setting information into a file and outputting the file.

6. The recording medium according to claim 5, wherein the setting checking information collecting program further causes the computer to execute testing, based on the collected setting information, excess or deficiency or consistency of the setting information and outputting the testing result.

* * * * *

UNITED STATES PATENT AND TRADEMARK OFFICE
CERTIFICATE OF CORRECTION

| | |
|---|---|
| PATENT NO. | : 8,027,967 B2 |
| APPLICATION NO. | : 12/458859 |
| DATED | : September 27, 2011 |
| INVENTOR(S) | : Toshiro Okada et al. |

It is certified that error appears in the above-identified patent and that said Letters Patent is hereby corrected as shown below:

IN THE SPECIFICATIONS:

Column 1, Line 14 (Approx.), After "contents" insert -- of --.

Column 1, Line 14 (Approx.), Delete "are" and insert -- is --, therefor.

Column 1, Line 14 (Approx.), Delete "incorporate d" and insert -- incorporated --, therefor.

Signed and Sealed this
Thirty-first Day of January, 2012

David J. Kappos
*Director of the United States Patent and Trademark Office*